US009673279B2

(12) United States Patent
Lee et al.

(10) Patent No.: US 9,673,279 B2
(45) Date of Patent: Jun. 6, 2017

(54) SEMICONDUCTOR DEVICE HAVING MULTI-CHANNEL AND METHOD OF FORMING THE SAME

(71) Applicant: SAMSUNG ELECTRONICS CO., LTD., Suwon-si, Gyeonggi-do (KR)

(72) Inventors: Jeongyun Lee, Yongin-si (KR);
Kwang-Yong Yang, Seoul (KR);
Keomyoung Shin, Seoul (KR);
Jinwook Lee, Seoul (KR); Yongseok Lee, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 15/208,007

(22) Filed: Jul. 12, 2016

(65) Prior Publication Data

US 2017/0110542 A1    Apr. 20, 2017

(30) Foreign Application Priority Data

Oct. 19, 2015    (KR) ........................ 10-2015-0145437

(51) Int. Cl.
| | | |
|---|---|---|
| *H01L 27/088* | (2006.01) | |
| *H01L 29/10* | (2006.01) | |
| *H01L 29/06* | (2006.01) | |
| *H01L 29/423* | (2006.01) | |
| *H01L 29/40* | (2006.01) | |
| *H01L 29/66* | (2006.01) | |
| *H01L 21/8234* | (2006.01) | |

(52) U.S. Cl.
CPC .. *H01L 29/1033* (2013.01); *H01L 21/823412* (2013.01); *H01L 29/0649* (2013.01); *H01L 29/401* (2013.01); *H01L 29/42364* (2013.01); *H01L 29/6653* (2013.01); *H01L 29/6656* (2013.01)

(58) Field of Classification Search
CPC ............ H01L 29/1033; H01L 29/6656; H01L 29/6653
USPC ....................................................... 257/401
See application file for complete search history.

(56) References Cited

U.S. PATENT DOCUMENTS

| | | |
|---|---|---|
| 7,183,152 B1 | 2/2007 | Dakshina-Murthy et al. |
| 8,062,963 B1 | 11/2011 | Van Dal |
| 8,173,551 B2 | 5/2012 | Bai et al. |
| 8,557,646 B2 | 10/2013 | Chen et al. |
| 8,673,723 B1 | 3/2014 | Na |
| 8,753,942 B2 | 6/2014 | Kuhn et al. |

(Continued)

FOREIGN PATENT DOCUMENTS

| | | |
|---|---|---|
| KR | 10-2014-0110704 A | 9/2014 |
| KR | 10-2014-0112061 A | 9/2014 |
| WO | WO 2013/104723 A1 | 7/2013 |

*Primary Examiner* — Anthony Ho
(74) *Attorney, Agent, or Firm* — Lee & Morse P.C.

(57) ABSTRACT

A semiconductor device includes an isolation pattern on a substrate, the isolation pattern having a lower insulating pattern on the substrate, and a spacer to cover side surfaces of the lower insulating pattern, a vertical structure through the isolation pattern to contact the substrate, the vertical structure having a first semiconductor layer on the substrate, a lower end of the first semiconductor layer being at a lower level than a lower surface of the isolation pattern, a second semiconductor layer on the first semiconductor layer, and a third semiconductor layer on the second semiconductor layer, and a gate electrode crossing the vertical structure and extending over the isolation pattern.

20 Claims, 21 Drawing Sheets

(56) References Cited

U.S. PATENT DOCUMENTS

| | | |
|---|---|---|
| 9,012,284 B2 | 4/2015 | Glass et al. |
| 9,099,388 B2 | 8/2015 | Lin et al. |
| 2013/0270607 A1 | 10/2013 | Doornbos et al. |
| 2014/0252475 A1 | 9/2014 | Xu |
| 2015/0076450 A1 | 3/2015 | Weman et al. |
| 2015/0144998 A1 | 5/2015 | Ching et al. |

SEMICONDUCTOR DEVICE HAVING MULTI-CHANNEL AND METHOD OF FORMING THE SAME

CROSS-REFERENCE TO RELATED APPLICATION

Korean Patent Application No. 10-2015-0145437, filed on Oct. 19, 2015, in the Korean Intellectual Property Office, and entitled: "Semiconductor Device Having Multi-Channel and Method of Forming the Same," is incorporated by reference herein in its entirety.

BACKGROUND

1. Field

Embodiments relate to a semiconductor device in which a nano-wire or a nano-sheet is used as a channel.

2. Description of the Related Art

As semiconductor devices are highly integrated, multi-channel transistors with vertical structures have been implemented. However, when a plurality of semiconductor patterns are vertically stacked on a substrate, a collapse phenomenon of the vertical patterns may occur.

SUMMARY

Embodiments provide a semiconductor device having an excellent electrical characteristic, in which vertical structures having a large aspect ratio are prevented from collapsing.

Other embodiments provide a method of forming a semiconductor device having an excellent electrical characteristic, in which vertical structures having a large aspect ratio are prevented from collapsing.

In accordance with an aspect of embodiments, a semiconductor device is provided. The device includes an isolation pattern formed on a substrate. A vertical structure which passes through the isolation pattern and is in contact with the substrate is formed. A gate electrode which crosses the vertical structure and extends over the isolation pattern is formed. The isolation pattern includes a lower insulating pattern formed on the substrate and a spacer which covers side surfaces of the lower insulating pattern. The vertical structure includes a first semiconductor layer formed on the substrate, a second semiconductor layer formed on the first semiconductor layer, and a third semiconductor layer formed on the second semiconductor layer. A lower end of the first semiconductor layer is formed at a lower level than a lower surface of the isolation pattern.

The lower insulating pattern may be directly in contact with the substrate. The lower end of the first semiconductor layer may be formed at a lower level than a lower end of the spacer.

The spacer may be formed between the first semiconductor layer and the lower insulating pattern. The first semiconductor layer may be directly in contact with the spacer.

A vertical height of the first semiconductor layer may be at least twice a horizontal width thereof.

An upper end of the first semiconductor layer may be formed at a higher level than an upper end of the lower insulating pattern. A lower end of the gate electrode may be formed at a lower level than the upper end of the first semiconductor layer.

The upper end of the first semiconductor layer may be formed at a lower level than the upper end of the lower insulating pattern. The lower end of the gate electrode may be formed at a lower level than the upper end of the lower insulating pattern.

The second semiconductor layer and the third semiconductor layer may be vertically aligned on the first semiconductor layer. The second semiconductor layer and the third semiconductor layer may be formed at a higher level than an upper end of the isolation pattern.

Edges of an upper surface of the first semiconductor layer may be formed at a lower level than a center of the upper surface of the first semiconductor layer. Edges of a lower surface of the second semiconductor layer may be formed at a lower level than a center of the lower surface of the second semiconductor layer. Edges of a lower surface of the third semiconductor layer may be formed at a lower level than a center of the lower surface of the third semiconductor layer.

The edges of the upper surface of the first semiconductor layer may be formed at a higher level than the center of the upper surface of the first semiconductor layer. Edges of an upper surface of the second semiconductor layer may be formed at a higher level than a center of the upper surface of the second semiconductor layer. Edges of an upper surface of the third semiconductor layer may be formed at a higher level than a center of the upper surface of the third semiconductor layer.

The gate electrode includes a work function layer and a low resistance layer formed on the work function layer. The work function layer may be elongated between the first semiconductor layer and the second semiconductor layer, may surround an upper surface, a lower surface, and side surfaces of the second semiconductor layer, and surround an upper surface, a lower surface, and side surfaces of the third semiconductor layer.

A gate dielectric layer may be formed between the work function layer and the first semiconductor layer, between the work function layer and the second semiconductor layer, and between the work function layer and the third semiconductor layer.

Upper ends of the gate dielectric layer, the work function layer, and the low resistance layer may be substantially the same plane.

A source/drain adjacent to side surfaces of the gate electrode and in contact with the side surfaces of the first semiconductor layer, the second semiconductor layer, and the third semiconductor layer may be formed.

An insulating plug may be formed on side surfaces of the source/drain. The insulating plug may be formed between the first semiconductor layer and the second semiconductor layer and between the second semiconductor layer and the third semiconductor layer. The insulating plug may be formed between the source/drain and the work function layer.

In accordance with embodiments, a semiconductor device is provided. The device includes an isolation pattern formed on a substrate. A vertical structure which passes through the isolation pattern, is in contact with the substrate, and protrudes more than the isolation pattern is formed. A gate electrode which crosses the vertical structure and extends over the isolation pattern is formed. The isolation pattern includes a lower insulating pattern formed on the substrate and a spacer which covers side surfaces of the lower insulating pattern and is directly in contact with the vertical structure. The vertical structure has at least three semiconductor layers.

In accordance with embodiments, a semiconductor device is provided. The device include an isolation pattern on a substrate, the isolation pattern having a lower insulating pattern on the substrate, and a spacer on side surfaces of the lower insulating pattern, a vertical structure extending through an entire thickness of the isolation pattern and contacting the substrate, the vertical structure having a first semiconductor layer through the isolation pattern, the first semiconductor layer extending beyond the isolation pattern into the substrate, and a second semiconductor layer on the first semiconductor layer, the second semiconductor layer being above the isolation pattern, and a third semiconductor layer on the second semiconductor layer, and a gate electrode crossing the vertical structure and extending over the isolation pattern.

A distance between a lower surface of the first semiconductor layer and a bottom of the substrate may be smaller than a distance between a lower surface of the isolation pattern and the bottom of the substrate.

The isolation pattern may overlap a majority of a vertical height of the first semiconductor layer.

A vertical height of the first semiconductor layer may be at least twice longer than a horizontal width of the first semiconductor.

The first semiconductor layer may be in direct contact with the spacer and substrate.

In accordance with embodiments, a method of forming a semiconductor device is provided. The method includes forming a trench passing through an isolation pattern formed on a substrate. The isolation pattern has a lower insulating pattern in contact with the substrate, a lower preliminary electrode pattern formed on the lower insulating pattern, and a spacer which covers side surfaces of the lower insulating pattern and the lower preliminary electrode pattern. A vertical structure having at least three semiconductor layers and sacrificial layers formed between the semiconductor layers is formed in the trench. An upper preliminary electrode which crosses the vertical structure is formed. Side surfaces of the vertical structure are exposed by partially removing the lower preliminary electrode pattern. A drain trench is formed by partially removing the vertical structure. A source/drain is formed in the drain trench. An upper insulating layer is formed on the source/drain. A gate trench is formed by removing the upper preliminary electrode and the lower preliminary electrode pattern. Gate holes are formed by removing the sacrificial layers. A gate electrode is formed in the gate trench and the gate holes.

The lower preliminary electrode pattern may include a material having an etch selectivity with respect to the lower insulating pattern. The upper preliminary electrode may include the same material as the lower preliminary electrode pattern.

Each of the lower preliminary electrode pattern and the upper preliminary electrode may include a polysilicon layer.

The upper preliminary electrode may be directly in contact with the lower preliminary electrode pattern.

The lower insulating pattern may be directly in contact with the substrate. A lower end of the vertical structure may be formed at a lower level than a lower end of the spacer.

Each of the semiconductor layers may include an Si layer formed by a selective epitaxial growth (SEG) method. Each of the sacrificial layers may include an SiGe layer formed by the SEG method.

The semiconductor layers may include a first semiconductor layer and a second semiconductor layer formed on the first semiconductor layer. A vertical height of the first semiconductor layer may be at least twice a horizontal width thereof.

Edges of an upper surface of the first semiconductor layer may be formed at a lower level than a center of the upper surface of the first semiconductor layer. Edges of a lower surface of the second semiconductor layer may be formed at a lower level than a center of the lower surface of the second semiconductor layer.

The edges of the upper surface of the first semiconductor layer may be formed at a higher level than the center of the upper surface of the first semiconductor layer. Edges of an upper surface of the second semiconductor layer may be formed at a higher level than a center of the upper surface of the second semiconductor layer.

The gate electrode may include a work function layer and a low resistance layer formed on the work function layer. The work function layer may be elongated between the first semiconductor layer and the second semiconductor layer and may surround an upper surface, a lower surface, and side surfaces of the second semiconductor layer.

A gate dielectric layer may be formed between the work function layer and the first semiconductor layer and between the work function layer and the second semiconductor layer.

Upper ends of the upper insulating layer, the gate dielectric layer, the work function layer, and the low resistance layer may be substantially the same plane.

An insulating plug may be formed on side surfaces of the source/drain. The insulating plug may be formed between the first semiconductor layer and the second semiconductor layer. The insulating plug may be formed between the source/drain and the work function layer.

The gate electrode may cross the semiconductor layers and extend over the lower insulating pattern. A lower end of the second semiconductor layer may be formed at a higher level than an upper end of the lower insulating pattern.

In accordance with embodiments, a method of forming a semiconductor device is provided. The method includes forming a lower insulating pattern and an isolation pattern having a spacer which covers side surfaces of the lower insulating pattern on a substrate. A vertical structure which passes through the isolation pattern and is in contact with the substrate is formed. The vertical structure has a first semiconductor layer formed on the substrate, a second semiconductor layer formed on the first semiconductor layer, and a third semiconductor layer formed on the second semiconductor layer. A gate electrode which crosses the vertical structure and extends over the isolation pattern is formed. A lower end of the first semiconductor layer is formed at a lower level than a lower surface of the isolation pattern.

BRIEF DESCRIPTION OF THE DRAWINGS

Features will become apparent to those of ordinary skill in the art by describing in detail example embodiments with reference to the attached drawings, in which.

DETAILED DESCRIPTION

Figure 1:
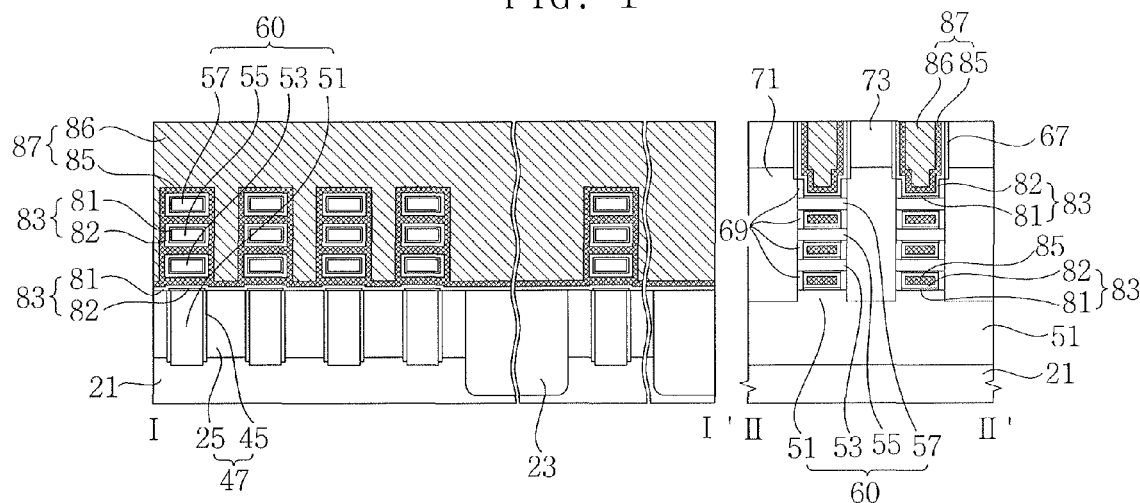
FIG. 1 illustrates a cross-sectional view of a semiconductor device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected to, or coupled to the other element or layer, or intervening elements or layers may be present. In contrast, when an element is referred to as being "directly on," "directly connected to," or "directly coupled to" another element or layer, there are no intervening elements or layers present. Like reference numerals throughout this specification denote like elements. As used herein, the term "and/or" includes any and all combinations of one or more of the associated listed items.

Spatially relative terms, such as "beneath," "below," "lower," "above," "upper," and the like, may be used herein for ease of description in describing one element's or feature's relationship to another/other element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

The example embodiments will be described with reference to cross-sectional views and/or plan views, which are ideal exemplary views. Thicknesses of layers and areas may be exaggerated for effective description of the technical contents in the drawings. Forms of the embodiments may be modified by the manufacturing technology and/or tolerance. Therefore, the embodiments are not intended to be limited to the illustrated specific forms, and may include modifications of forms, for example, generated according to manufacturing processes. For example, an etching area illustrated at a right angle may be round or have a predetermined curvature. Therefore, areas illustrated in the drawings have schematic properties, and shapes of the areas are illustrated special forms of the areas of a device, and are not intended to be limited.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Terms such as "front side," and "back side" may be used in a relative sense herein to facilitate easy understanding of embodiments. Accordingly, "front side," and "back side" may not refer to any specific direction, location, or component, and may be used interchangeably. For example, "front side" may be interpreted as "back side" and vice versa. Also, "front side" may be expressed as "first side," and "back side" may be expressed as "second side," and vice versa. However, "front side," and "back side" cannot be used interchangeably in the same embodiment.

The term "near" is intended to mean that one among two or more components is located within relatively close proximity of a certain other component. For example, it should be understood that when a first end is near a first side, the first end may be closer to the first side than a second end, or the first end may be closer to the first side than to a second side.

Figure 2:
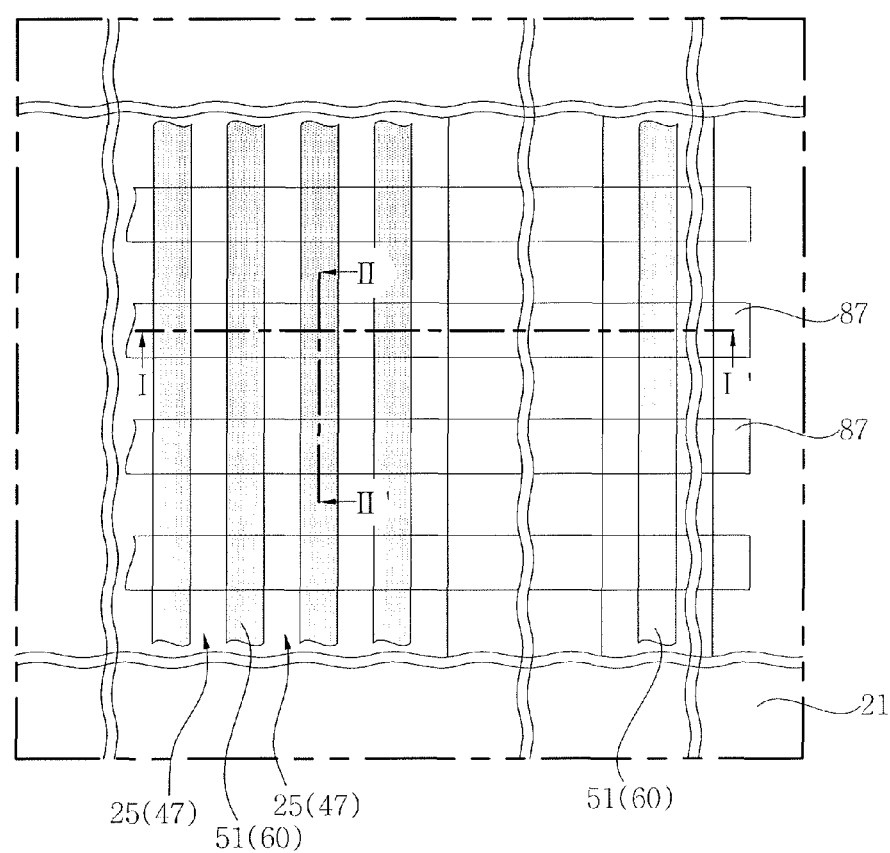
FIG. 2 illustrates a layout of a semiconductor device according to an embodiment.

FIG. 1 is a cross-sectional view for describing a semiconductor device according to an embodiment. FIG. 2 is a layout for describing the semiconductor device according to the embodiment. FIG. 1 is a cross-sectional view taken along lines I-I' and II-IP of FIG. 2. FIGS. 3 to 13 are cross-sectional views illustrating a portion of FIG. 1 in detail.

Referring to FIGS. 1 and 2, a semiconductor device according to an embodiment may include an isolation layer 23 formed on a substrate 21, lower insulating patterns 25, spacers 45, a first semiconductor layer 51, a second semiconductor layer 53, a third semiconductor layer 55, a fourth semiconductor layer 57, gate spacers 67, insulating plugs 69, sources/drains 71, an upper insulating layer 73, a gate dielectric layer 83, and gate electrodes 87. The lower insulating pattern 25 and the spacer 45 may constitute an isolation pattern 47. The first semiconductor layer 51, the second semiconductor layer 53, the third semiconductor layer 55, and the fourth semiconductor layer 57 may constitute a vertical structure 60. A plurality of vertical structures 60 may be parallel to each other. The gate dielectric layer 83 may include a first gate dielectric layer 81 and a second gate dielectric layer 82. The gate electrode 87 may include a work function layer 85 and a low resistance layer 86. The gate electrode 87 may cross the vertical structures 60. The gate electrode 87 may be referred to as a replacement gate electrode.

The spacers 45 may cover side surfaces of the lower insulating pattern 25. The first semiconductor layer 51 may be directly in contact with the substrate 21 by passing through the isolation patterns 47. A lower end of the first semiconductor layer 51 may be formed at a lower level than a lower surface of the isolation pattern 47. The vertical structure 60 may protrude above, e.g., more than, the isolation pattern 47. The gate electrode 87 may cover upper and side surfaces of the vertical structure 60 and extend over the isolation pattern 47 and the isolation layer 23.

Figure 3:
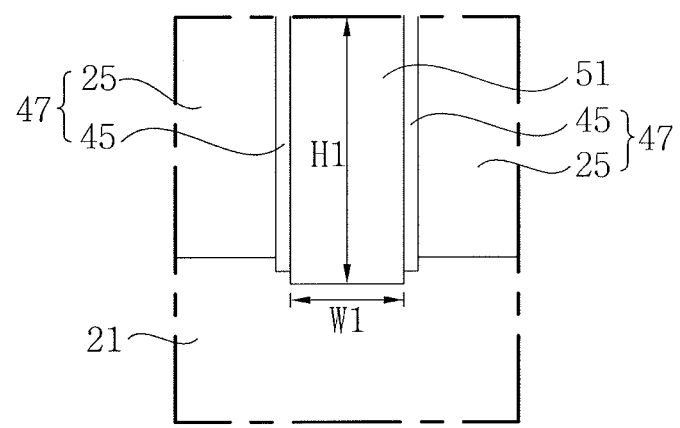
FIGS. 3 to 13 illustrate cross-sectional views of a portion of FIG. 1 in detail.

For example, referring to FIG. 3, the lower insulating pattern 25 may be directly in contact with the substrate 21. A lower end of the spacer 45 may be formed at a lower level than a lower end of the lower insulating pattern 25. The spacer 45 may be formed between the lower insulating pattern 25 and the first semiconductor layer 51. The first semiconductor layer 51 may be directly in contact with the spacer 45. The lower end of the first semiconductor layer 51 may be formed at a lower level than a lower end of the isolation pattern 47. The lower end of the first semiconductor layer 51 may be formed at a lower level than the lower end of the spacer 45. The lower end of the first semiconductor layer 51 may be formed at a lower level than an upper end of the substrate 21. The first semiconductor layer 51 may be directly in contact with the substrate 21.

A vertical height H1 of the first semiconductor layer 51 may be greater than a horizontal width W1 thereof. The vertical height H1 of the first semiconductor layer 51 may be at least twice the horizontal width W1. When the vertical height H1 of the first semiconductor layer 51 is at least twice the horizontal width W1, if crystallographic defects are included in a surface of the substrate 21, a failure due to the crystallographic defects in the substrate 21 may be trapped in a lower region of the first semiconductor layer 51. Therefore, a semiconductor layer having no failure may be formed in an upper region of the first semiconductor layer 51. In an embodiment, the vertical height H1 of the first semiconductor layer 51 may be twice to one million times the horizontal width W1.

Figure 4:
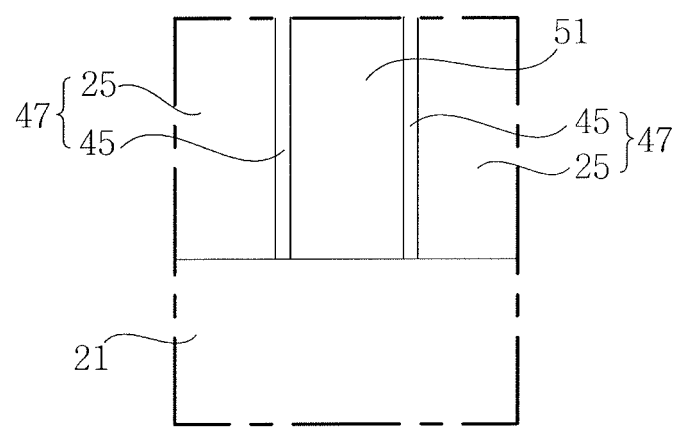

In another example, referring to FIG. 4, the lower end of the first semiconductor layer 51 may be formed at the same level as the lower end of the isolation pattern 47. The lower end of the spacer 45 may be formed at the same level as the lower end of the lower insulating pattern 25.

Figure 5:
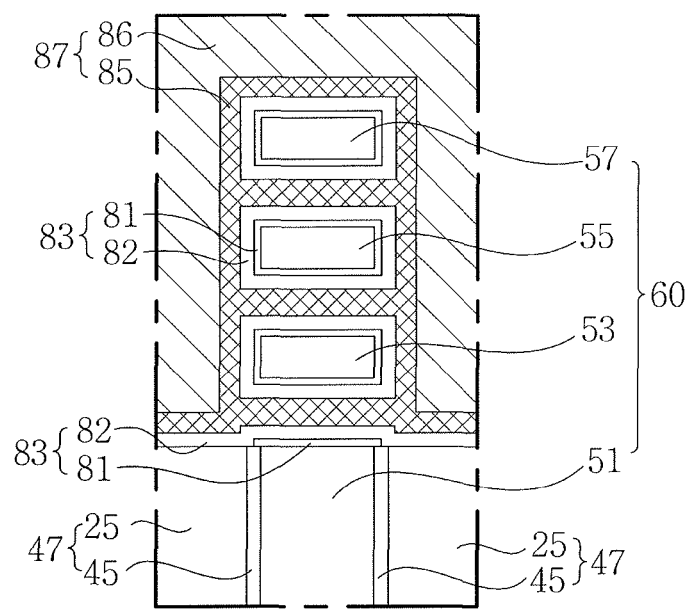

For example, referring to FIG. 5, upper surfaces of the lower insulating pattern 25, the spacer 45, and the first semiconductor layer 51 may be substantially the same plane, e.g., level with each other. The second semiconductor layer 53, the third semiconductor layer 55, and the fourth semiconductor layer 57 may be vertically aligned on the first semiconductor layer 51. The second semiconductor layer 53, the third semiconductor layer 55, and the fourth semiconductor layer 57 may be formed at a higher level than an upper end of the isolation pattern 47.

The first gate dielectric layer 81 may be directly in contact with the first semiconductor layer 51, the second semiconductor layer 53, the third semiconductor layer 55, and the fourth semiconductor layer 57. The first gate dielectric layer 81 may surround upper surfaces, lower surfaces, and side surfaces of the second semiconductor layer 53, the third semiconductor layer 55, and the fourth semiconductor layer 57.

The second gate dielectric layer 82 may cover the first gate dielectric layer 81. The second gate dielectric layer 82 may cover the lower insulating pattern 25, the spacer 45, and the first gate dielectric layer 81. The second gate dielectric layer 82 may surround the second semiconductor layer 53, the third semiconductor layer 55, and the fourth semiconductor layer 57. The first gate dielectric layer 81 may be interposed between the second gate dielectric layer 82 and the first semiconductor layer 51, between the second gate dielectric layer 82 and the second semiconductor layer 53, between the second gate dielectric layer 82 and the third semiconductor layer 55, and between the second gate dielectric layer 82 and the fourth semiconductor layer 57.

The work function layer 85 may cover the vertical structure 60. The work function layer 85 may cover the first semiconductor layer 51 and surround the upper surfaces, the lower surfaces, and the side surfaces of the second semiconductor layer 53, the third semiconductor layer 55, and the fourth semiconductor layer 57. The second gate dielectric layer 82 may be interposed between the work function layer 85 and the first gate dielectric layer 81. The low resistance layer 86 may be formed on the work function layer 85. The work function layer 85 may be interposed between the low resistance layer 86 and the second gate dielectric layer 82.

Figure 6:
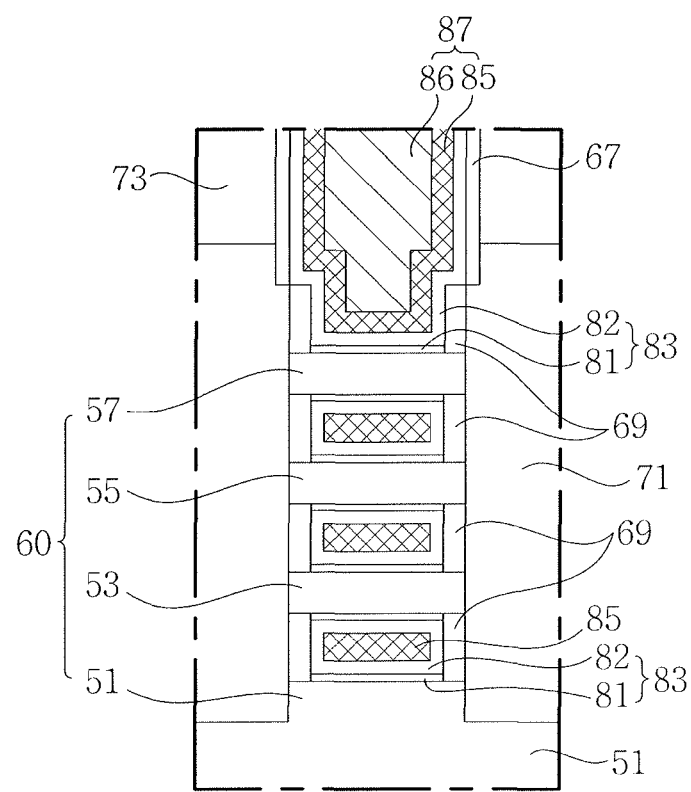

Referring to FIG. 6, the first semiconductor layer 51, the second semiconductor layer 53, the third semiconductor layer 55, and the fourth semiconductor layer 57 may be directly in contact with the sources/drains 71. The work function layer 85 may be formed between the first semiconductor layer 51 and the second semiconductor layer 53, between the second semiconductor layer 53 and the third semiconductor layer 55, between the third semiconductor layer 55 and the fourth semiconductor layer 57, and over the fourth semiconductor layer 57. The insulating plugs 69 may be formed between the work function layer 85 and the sources/drains 71. The insulating plugs 69 may be directly in contact with the sources/drains 71. The insulating plugs 69 may be formed between the first semiconductor layer 51 and the second semiconductor layer 53, between the second semiconductor layer 53 and the third semiconductor layer 55, between the third semiconductor layer 55 and the fourth semiconductor layer 57, and over the fourth semiconductor layer 57. The second gate dielectric layer 82 may be interposed between the insulating plugs 69 and the work function layer 85. Upper surfaces of the low resistance layer 86, the work function layer 85, the second gate dielectric layer 82, the gate spacer 67, and the upper insulating layer 73 may be substantially the same plane.

Figure 7:
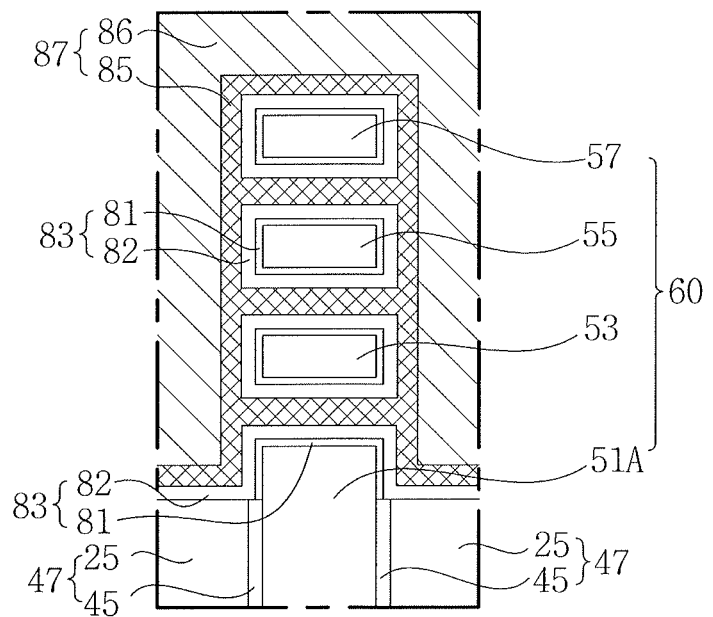

In another example, referring to FIG. 7, an upper end of a first semiconductor layer 51A may be formed at a higher level than an upper end of the lower insulating pattern 25. The first gate dielectric layer 81 may cover an upper surface and side surfaces of the first semiconductor layer 51A. A lower end of the gate electrode 87 may be formed at a lower level than the upper end of the first semiconductor layer 51A. A lower end of the work function layer 85 may be formed at a lower level than the upper end of the first semiconductor layer 51A.

Figure 8:
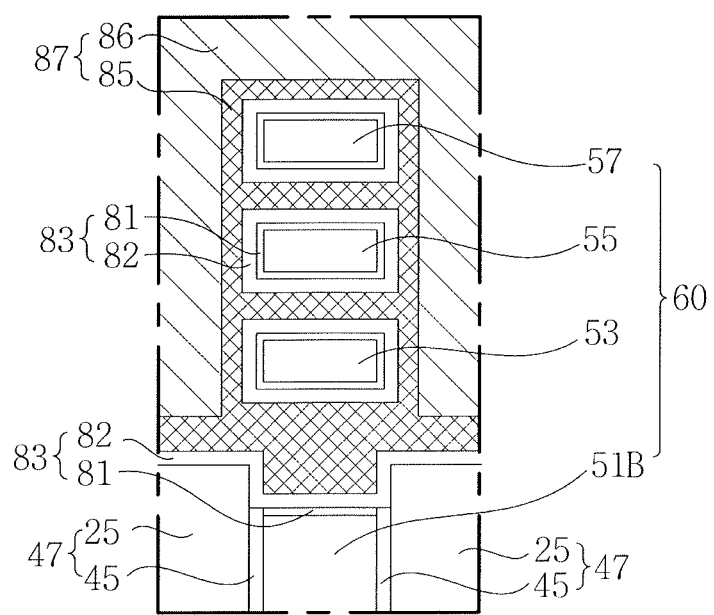

In another example, referring to FIG. 8, an upper end of a first semiconductor layer 51B may be formed at a lower level than the upper end of the lower insulating pattern 25. The second gate dielectric layer 82 may cover side surfaces of the isolation pattern 47. In an embodiment, the second gate dielectric layer 82 may be directly in contact with an upper surface and side surfaces of the lower insulating pattern 25. The lower end of the gate electrode 87 may be formed at a lower level than the upper end of the lower insulating pattern 25. The lower end of the work function layer 85 may be formed at a lower level than the upper end of the lower insulating pattern 25. The work function layer 85 may cover the side surfaces of the isolation pattern 47.

Figure 9:
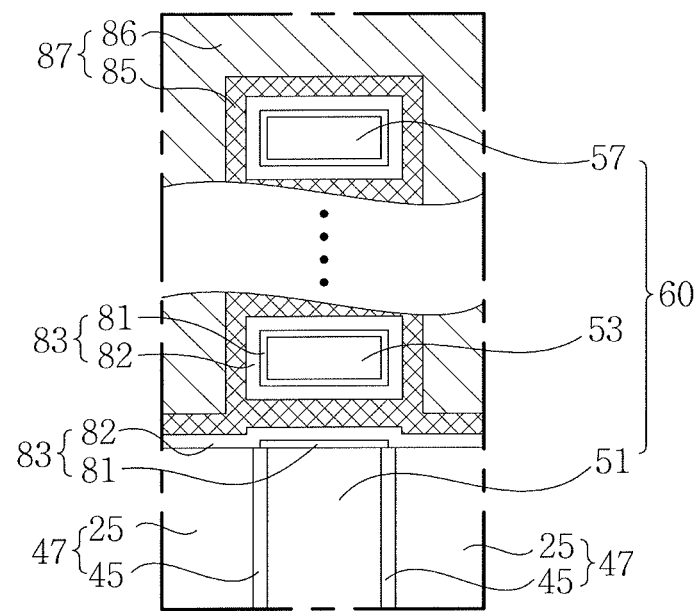

In another example, referring to FIG. 9, a plurality of other semiconductor layers having a configuration similar to the second semiconductor layer 53 may be repeatedly formed between the second semiconductor layer 53 and the fourth semiconductor layer 57.

Figure 10:
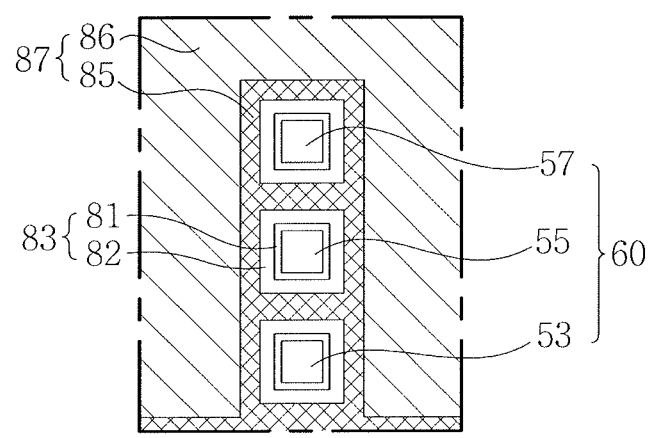

In another example, referring to FIG. 10, the second semiconductor layer 53, the third semiconductor layer 55, and the fourth semiconductor layer 57 may have a shape similar to a square shape.

Figure 11:
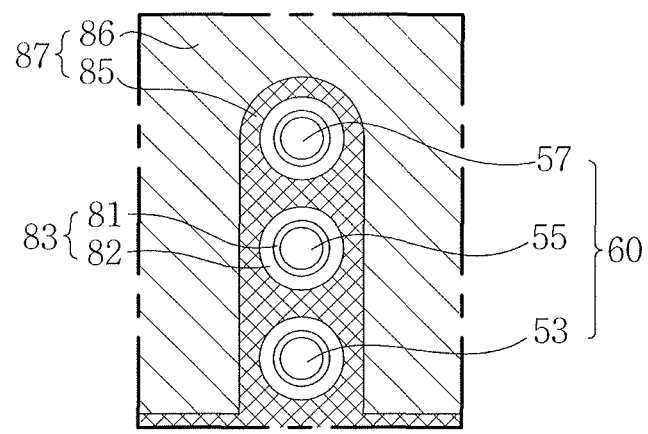

In another example, referring to FIG. 11, the second semiconductor layer 53, the third semiconductor layer 55, and the fourth semiconductor layer 57 may have a shape similar to a circular shape. In an embodiment, the second semiconductor layer 53, the third semiconductor layer 55, and the fourth semiconductor layer 57 may have a shape similar to an elliptical shape.

Figure 12:
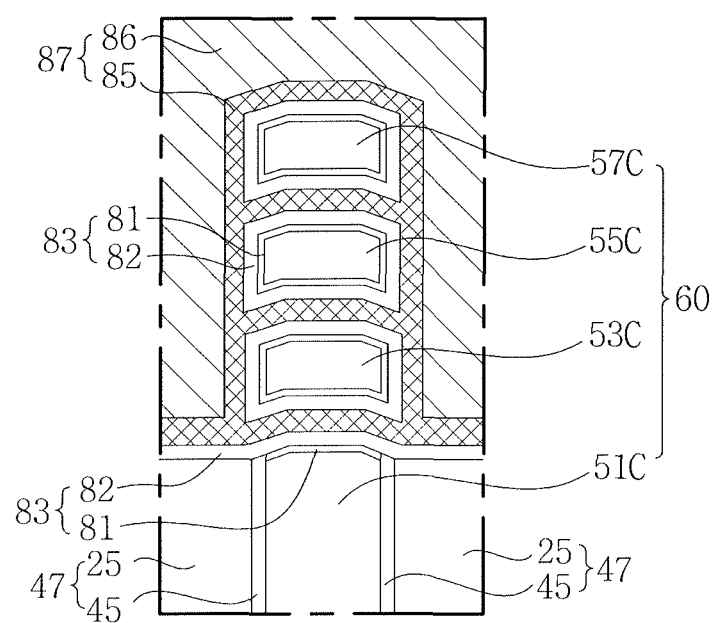

In another example, referring to FIG. 12, edges of an upper surface of a first semiconductor layer 51C may be formed at a lower level than the center of the upper surface of the first semiconductor layer 51C. Edges of an upper surface of each of a second semiconductor layer 53C, a third semiconductor layer 55C, and a fourth semiconductor layer 57C may be formed at a lower level than the center of the upper surface of each of the second semiconductor layer 53C, the third semiconductor layer 55C, and the fourth semiconductor layer 57C. Edges of a lower surface of each of the second semiconductor layer 53C, the third semiconductor layer 55C, and the fourth semiconductor layer 57C may be formed at a lower level than the center of the lower surface of each of the second semiconductor layer 53C, the third semiconductor layer 55C, and the fourth semiconductor layer 57C.

Figure 13:
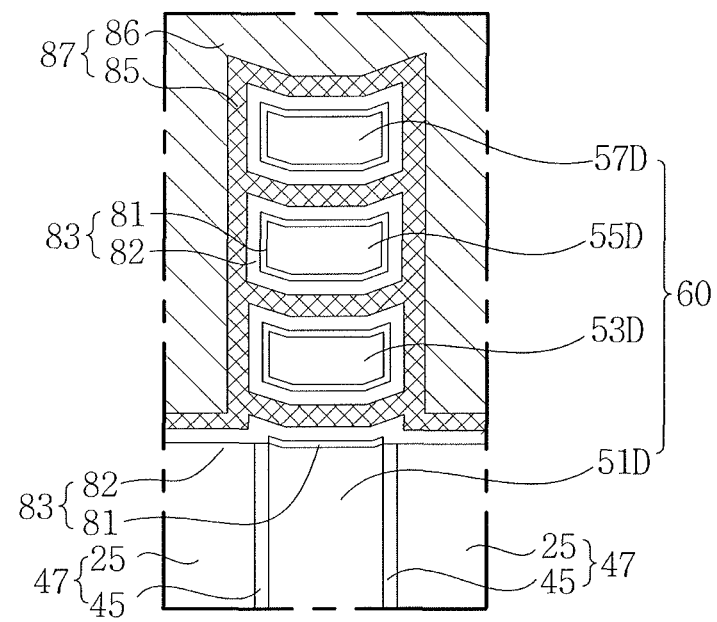

In another example, referring to FIG. 13, edges of an upper surface of a first semiconductor layer 51D may be formed at a higher level than the center of the upper surface of the first semiconductor layer 51D. Edges of an upper surface of each of a second semiconductor layer 53D, a third semiconductor layer 55D, and a fourth semiconductor layer 57D may be formed at a higher level than the center of the upper surface of each of the second semiconductor layer 53D, the third semiconductor layer 55D, and the fourth semiconductor layer 57D. Edges of a lower surface of each of the second semiconductor layer 53D, the third semiconductor layer 55D, and the fourth semiconductor layer 57D may be formed at a higher level than the center of the lower surface of each of the second semiconductor layer 53D, the third semiconductor layer 55D, and the fourth semiconductor layer 57D.

FIGS. 14 to 22, 24, 27, 28, and 35 to 42 are cross-sectional views taken along lines I-I' and/or II-II' of FIG. 2 for describing a method of forming a semiconductor device according to an embodiment.

Figure 14:
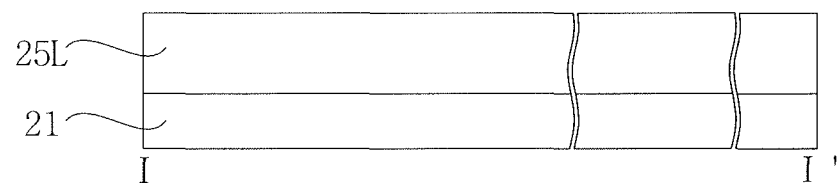
FIGS. 14 to 22, 24, 27, 28, and 35 to 42 illustrate cross-sectional views of stages in a method of forming a semiconductor device according to an embodiment.

Referring to FIGS. 2 and 14, a lower insulating layer 25L may be formed on, e.g., directly on, the substrate 21. The lower insulating layer 25L may cover a surface of the substrate 21. An upper surface of the lower insulating layer 25L may be planarized. The upper surface of the lower insulating layer 25L may be formed over the entire surface of the substrate 21 to have a very uniform level, e.g., the entire upper surface of the lower insulating layer 25L may be completely flat to be at a constant distance from a bottom of the substrate 21. The substrate 21 may include a semiconductor substrate, e.g., a silicon wafer or a silicon on insulator (SOI) wafer. The lower insulating layer 25L may include an insulating layer, e.g., silicon oxide, silicon nitride, silicon oxynitride, low-K dielectrics, or a combination thereof.

Figure 15:
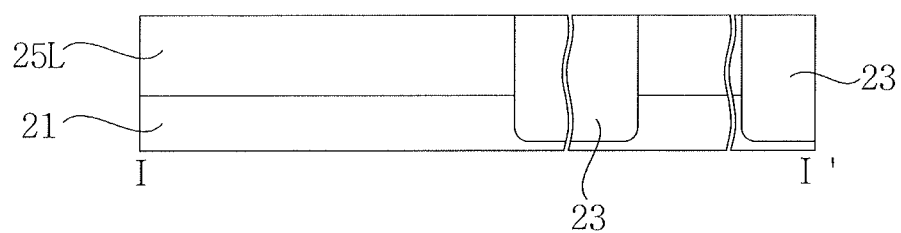

Referring to FIGS. 2 and 15, the isolation layer 23 may be formed. The isolation layer 23 may be elongated inside the substrate 21 by passing through the lower insulating layer 25L. A lower end of the isolation layer 23 may be formed at a lower level than a lower end of the lower insulating layer 25L. The isolation layer 23 may include an insulating layer, e.g., silicon oxide, silicon nitride, silicon oxynitride, or a combination thereof.

Figure 16:
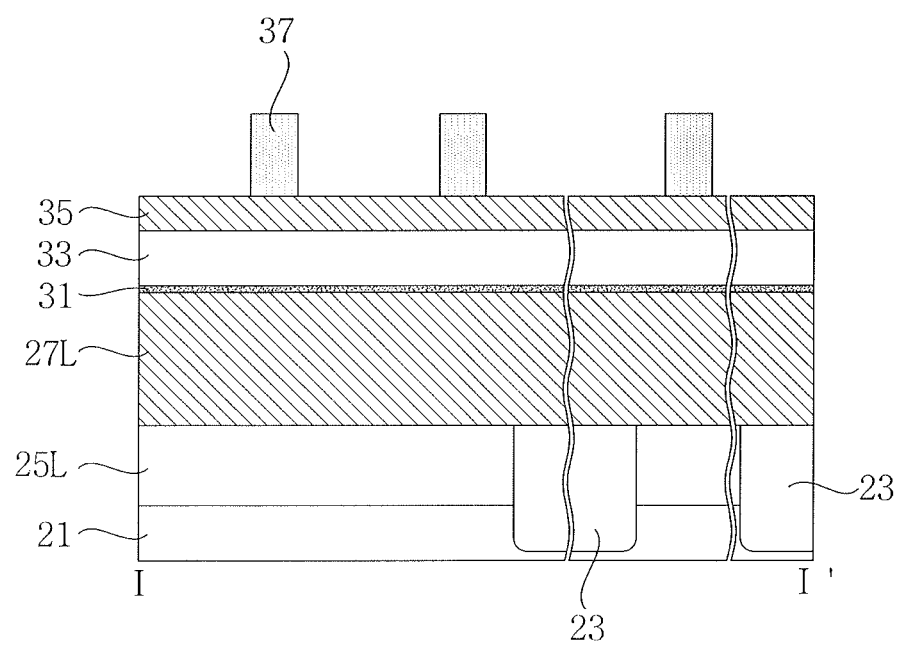

Referring to FIGS. 2 and 16, a lower preliminary electrode layer 27L, a capping layer 31, a first mask layer 33, a second mask layer 35, and third mask patterns 37 may be formed.

The lower preliminary electrode layer 27L may cover the lower insulating layer 25L. The lower preliminary electrode layer 27L may include a different material from that of the lower insulating layer 25L. The lower preliminary electrode layer 27L may include a material having an etch selectivity with respect to the lower insulating layer 25L. For example, the lower preliminary electrode layer 27L may include a polysilicon layer. The capping layer 31 may cover the lower preliminary electrode layer 27L. The capping layer 31 may include a different material from that of the lower preliminary electrode layer 27L. The capping layer 31 may include a material having an etch selectivity with respect to the lower preliminary electrode layer 27L. For example, the capping layer 31 may include silicon nitride.

The first mask layer 33 may cover the capping layer 31. The first mask layer 33 may include a different material from those of the capping layer 31 and the lower preliminary electrode layer 27L. The first mask layer 33 may include a material having an etch selectivity with respect to the capping layer 31 and the lower preliminary electrode layer 27L. For example, the first mask layer 33 may include silicon oxide. The second mask layer 35 may cover the first mask layer 33. The second mask layer 35 may include a different material from that of the first mask layer 33. The second mask layer 35 may include a material having an etch selectivity with respect to the first mask layer 33. For example, the second mask layer 35 may include a polysilicon layer. The third mask patterns 37 may be formed on the second mask layer 35. The third mask patterns 37 may include a different material from that of the second mask layer 35. For example, the third mask patterns 37 may include a photoresist or a spin-on hardmask (SOH). The third mask patterns 37 may be formed using a photolithography process.

Figure 17:
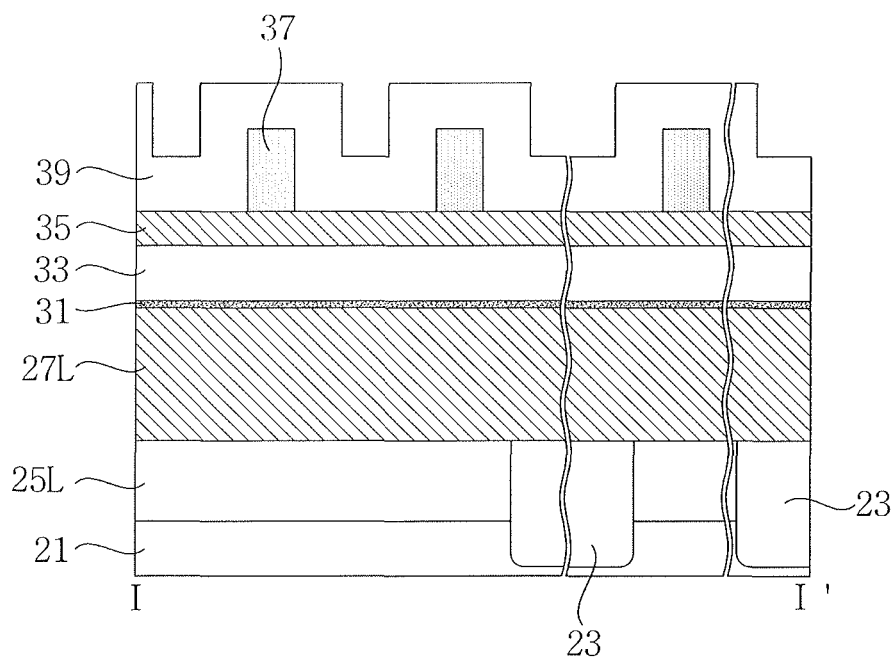

Referring to FIGS. 2 and 17, a fourth mask layer 39 may be formed. The fourth mask layer 39 may cover the surface of the substrate 21 to have a uniform thickness. The fourth mask layer 39 may include a different material from those of the second mask layer 35 and the third mask pattern 37. The fourth mask layer 39 may include a material having an etch selectivity with respect to the second mask layer 35 and the third mask pattern 37. For example, the fourth mask layer 39 may include an atomic layer deposition (ALD) oxide. The fourth mask layer 39 may cover side surfaces of the third mask patterns 37.

Figure 18:
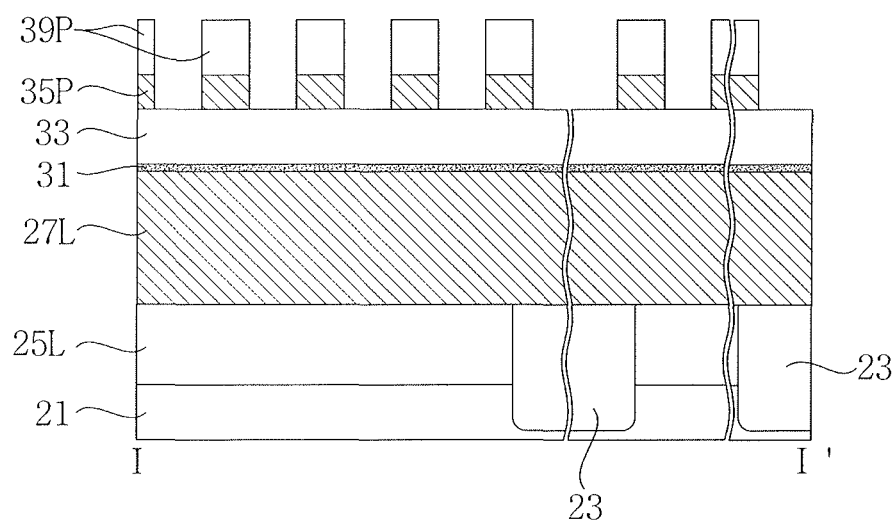

Referring to FIGS. 2 and 18, fourth mask patterns 39P may be formed by performing an anisotropic etching process on the fourth mask layer 39. The third mask patterns 37 and the second mask layer 35 may be exposed. The second mask layer 35 may be exposed by removing the third mask patterns 37. Second mask patterns 35P which partially expose the first mask layer 33 may be formed by patterning the second mask layer 35 using the fourth mask patterns 39P as etch masks.

Figure 19:
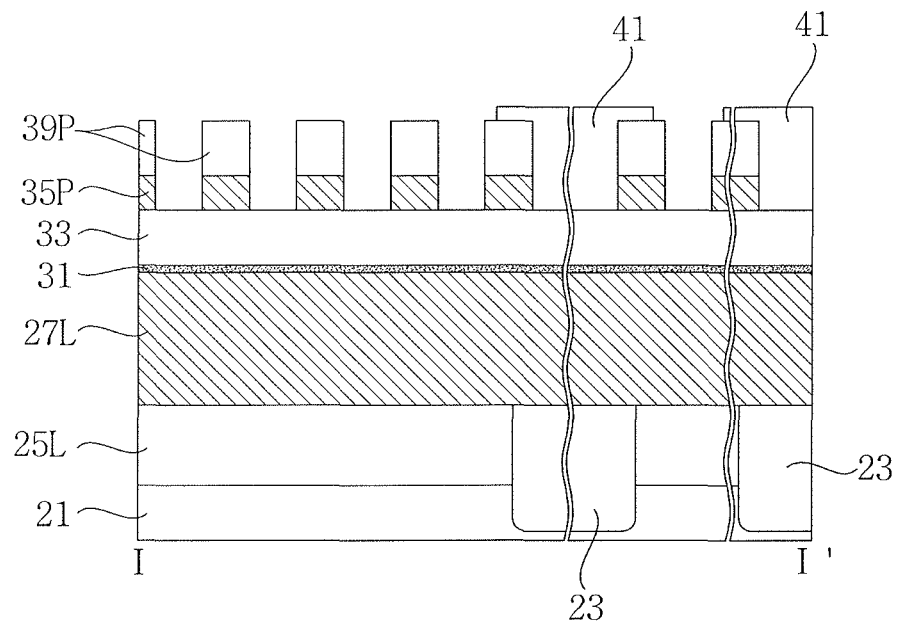

Referring to FIGS. 2 and 19, fifth mask patterns 41 which partially cover the second mask patterns 35P and the first mask layer 33 may be formed. The fifth mask pattern 41 may include a material having an etch selectivity with respect to the first mask layer 33. For example, the fifth mask pattern 41 may include an SOH.

Figure 20:
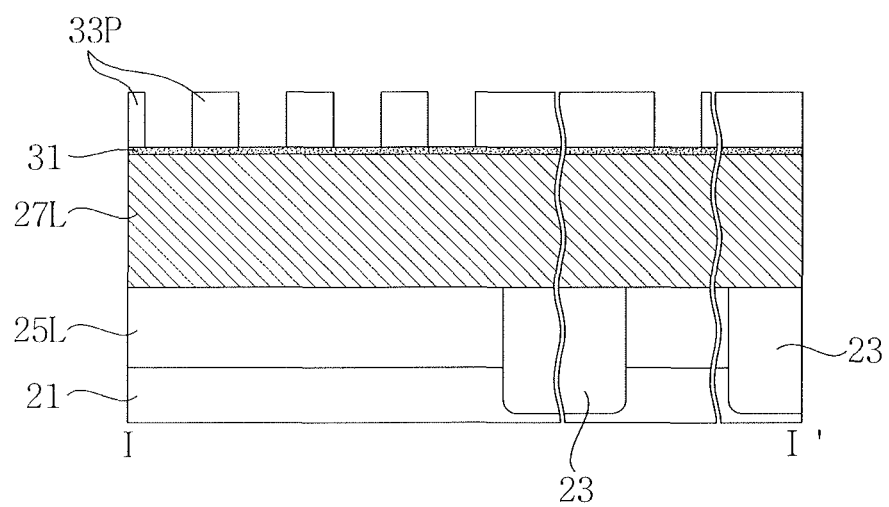

Referring to FIGS. 2 and 20, first mask patterns 33P may be formed by patterning the first mask layer 33 using the fifth mask pattern 41, the fourth mask pattern 39P, and the second mask pattern 35P as etch masks.

Figure 21:
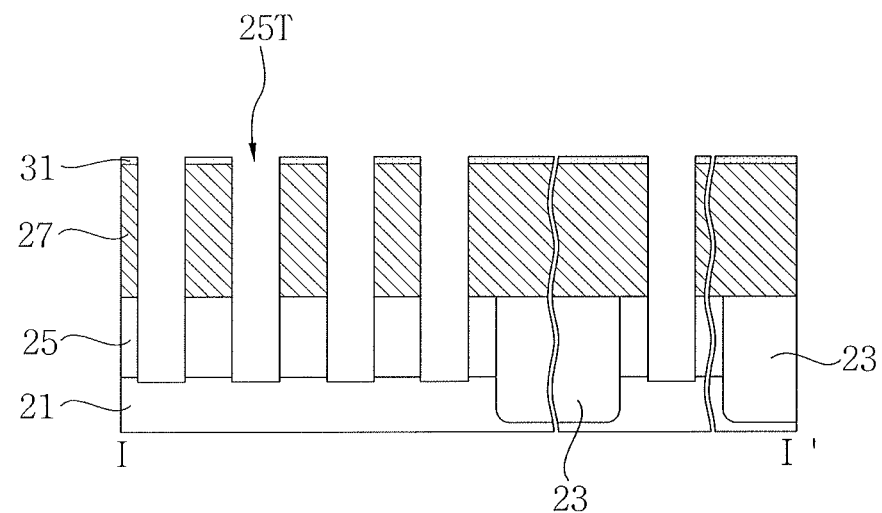

Referring to FIGS. 2 and 21, trenches 25T may be formed by patterning the capping layer 31, the lower preliminary electrode layer 27L, and the lower insulating layer 25L using the first mask patterns 33P as etch masks. Lower preliminary electrode patterns 27 and lower insulating patterns 25 may be formed by patterning the lower preliminary electrode layer 27L and the lower insulating layer 25L. The capping layer 31 may remain on the lower preliminary electrode pattern 27. The substrate 21 may be exposed on bottoms of the trenches 25T, e.g., the trenches 25T may extend through an entire thickness of the lower insulating layer 25L to expose the substrate 21 between adjacent lower insulating patterns 25. The first mask patterns 33P may be removed.

Figure 22:
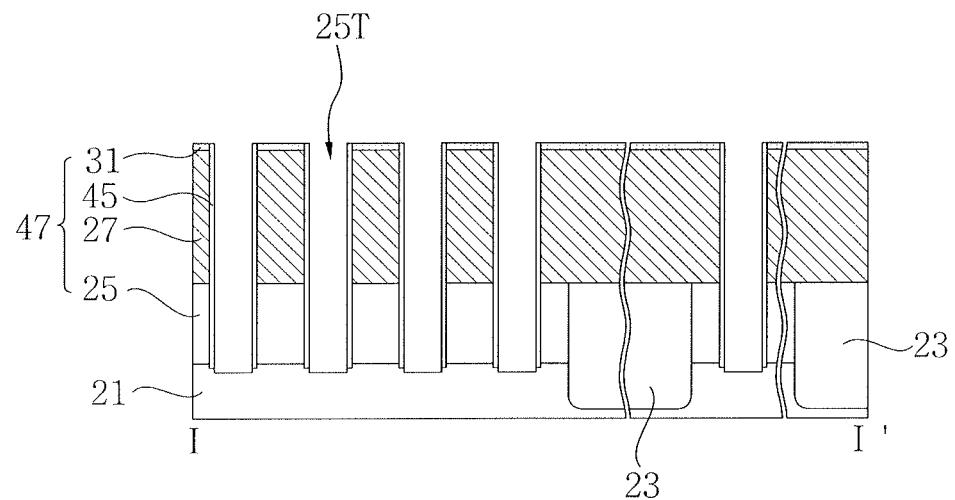

Referring to FIGS. 2 and 22, the spacers 45 may be formed. For example, the spacers 45 may be conformally formed along, e.g., entire, inner sidewalls of the trenches 25T. Accordingly, a structure including the stacked lower insulating pattern 25, lower preliminary electrode pattern 27, and capping layer 31 may include the spacers 45 on opposite side surfaces thereof to define the isolation pattern 47. In other words, the lower insulating pattern 25, the lower preliminary electrode pattern 27, the capping layer 31, and the spacers 45 may constitute the isolation pattern 47. Each isolation pattern 47 may be positioned between two adjacent trenches 25T. A vertical height of each of the trenches 25T may be greater than a horizontal width thereof to define trenches 25T with high aspect ratios.

A thin film forming process and an anisotropic etching process may be applied to the formation of the spacers 45. The spacers 45 may cover side surfaces of the lower insulating patterns 25, the lower preliminary electrode patterns 27, and the capping layer 31. The spacers 45 may include a different material from that of the lower preliminary electrode patterns 27. The spacers 45 may include a material having an etch selectivity with respect to the lower preliminary electrode patterns 27. The spacers 45 may include an insulating layer, e.g., silicon oxide, silicon nitride, silicon oxynitride, or a combination thereof.

Figure 23:
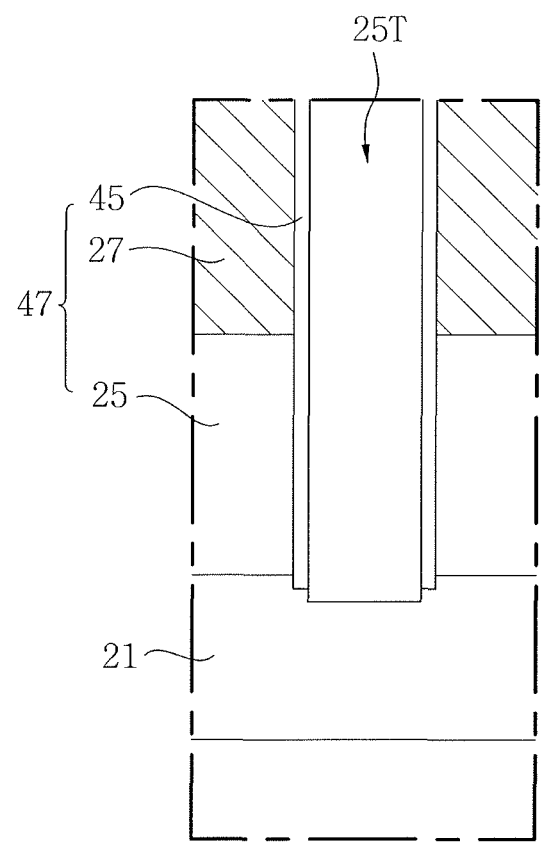
FIG. 23 illustrates a cross-sectional view of a portion of FIG. 22 in detail.

FIG. 23 is a detailed, partial cross-sectional view of the trench 25T of FIG. 22.

Referring to FIG. 23, the bottom of the trench 25T may be formed at a lower level than a lower end of the isolation pattern 47. For example, a lower end of the spacer 45 may be formed at a lower level than a lower end of the lower insulating pattern 25, and the bottom of the trench 25T may be formed at a lower level than the lower end of the spacer 45. In another example, the bottom of the trench 25T may be formed at the same level as the lower end of the isolation pattern 47, and the lower end of the spacer 45 may be formed at the same level as the lower end of the lower insulating pattern 25.

Figure 24:
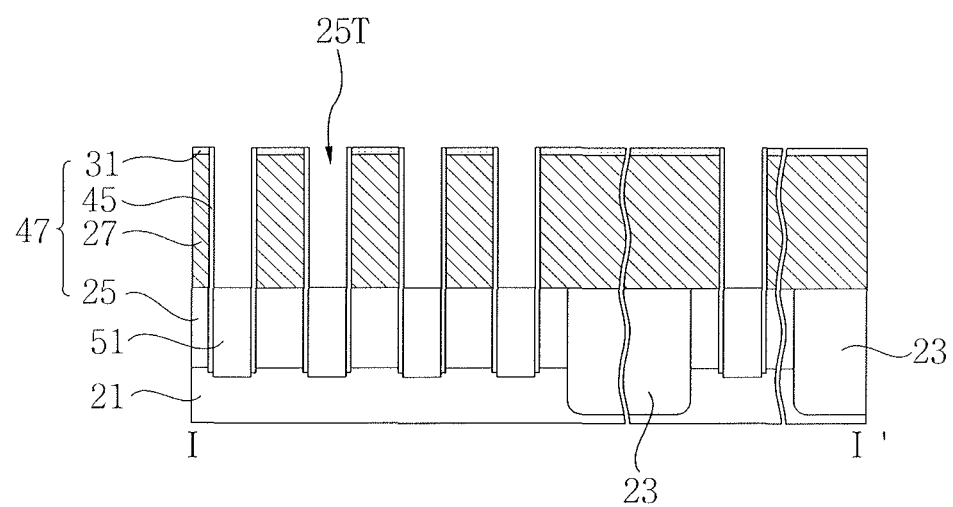

Referring to FIGS. 2 and 24, the first semiconductor layer 51 may be formed in the trenches 25T. The first semiconductor layer 51 may include a semiconductor formed by a selective epitaxial growth (SEG) method. For example, the first semiconductor layer 51 may be a silicon (Si) layer. An upper surface of the first semiconductor layer 51 may be formed at substantially the same level as upper surfaces of the lower insulating patterns 25. A lower surface of the first semiconductor layer 51 may be directly in contact with the substrate 21. A vertical height of the first semiconductor layer 51 may be greater than a horizontal width thereof.

In an embodiment, the vertical height of the first semiconductor layer 51 may be at least twice the horizontal width thereof. In detail, as crystallographic defects may be included in the surface of the substrate 21, a failure due to the crystallographic defects included in the substrate 21 may grow in a lower region of the first semiconductor layer 51, e.g., the failure due to the crystallographic defects included in the substrate 21 may be grown along an inclination of about 55 degrees. Therefore, when the vertical height of the first semiconductor layer 51 is at least twice the horizontal width thereof, the failure due to the crystallographic defects included in the substrate 21 may be trapped, e.g., only, in the lower region of the first semiconductor layer 51. Accordingly, a semiconductor layer having no failure may grow in an upper region of the first semiconductor layer 51. In an embodiment, the vertical height of the first semiconductor layer 51 may be twice to one million times the horizontal width thereof.

Figure 25:
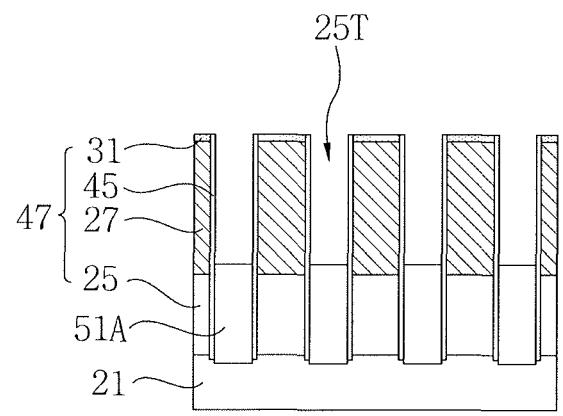
FIGS. 25 and 26 illustrate cross-sectional views of a portion of FIG. 24 in detail.
Figure 26:
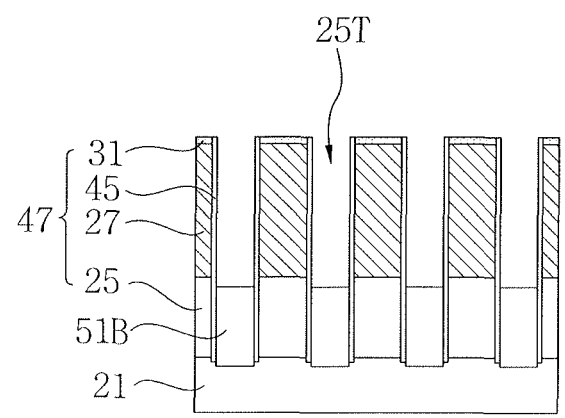

FIGS. 25 and 26 are cross-sectional views illustrating a portion of FIG. 24 in detail. For example, referring to FIG. 25, an upper end of a first semiconductor layer 51A may be formed at a higher level than an upper end of the lower insulating pattern 25. In another example, referring to FIG. 26, an upper end of a first semiconductor layer 51B may be formed at a lower level than the upper end of the lower insulating pattern 25.

Figure 27:
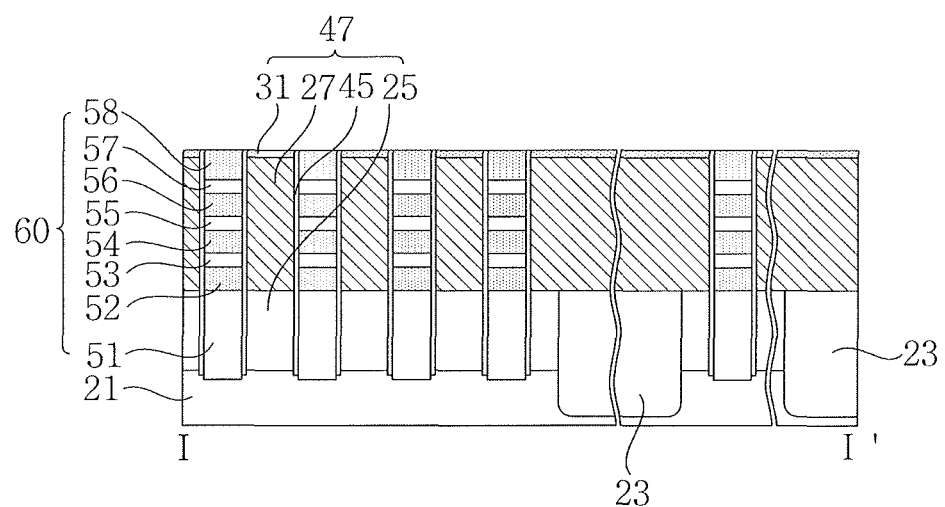

Referring to FIGS. 2 and 27, a first sacrificial layer 52, the second semiconductor layer 53, a second sacrificial layer 54, the third semiconductor layer 55, a third sacrificial layer 56, the fourth semiconductor layer 57, and a fourth sacrificial layer 58 may be formed on the first semiconductor layer 51. The first semiconductor layer 51, the first sacrificial layer 52, the second semiconductor layer 53, the second sacrificial layer 54, the third semiconductor layer 55, the third sacrificial layer 56, the fourth semiconductor layer 57, and the fourth sacrificial layer 58 may constitute a vertical structure 60. The first semiconductor layer 51, the first sacrificial layer 52, the second semiconductor layer 53, the second sacrificial layer 54, the third semiconductor layer 55, the third sacrificial layer 56, the fourth semiconductor layer 57, and the fourth sacrificial layer 58 may be sequentially stacked in the trench 25T. The vertical structure 60 may fully fill the inside of the trench 25T. The isolation pattern 47 may serve to prevent the vertical structure 60 from collapsing.

The second semiconductor layer 53, the third semiconductor layer 55, and the fourth semiconductor layer 57 may include a semiconductor formed by a SEG method. For example, the second semiconductor layer 53, the third semiconductor layer 55, and the fourth semiconductor layer 57 may include the same material as that of the first semiconductor layer 51. The second semiconductor layer 53, the third semiconductor layer 55, and the fourth semiconductor layer 57 may be a silicon (Si) layer.

The first sacrificial layer 52, the second sacrificial layer 54, the third sacrificial layer 56, and the fourth sacrificial layer 58 may include a different material from those of the first semiconductor layer 51, the second semiconductor layer 53, the third semiconductor layer 55, and the fourth semiconductor layer 57. The first sacrificial layer 52, the second sacrificial layer 54, the third sacrificial layer 56, and the fourth sacrificial layer 58 may include a material having an etch selectivity with respect to the first semiconductor layer 51, the second semiconductor layer 53, the third semiconductor layer 55, and the fourth semiconductor layer 57. The first sacrificial layer 52, the second sacrificial layer 54, the third sacrificial layer 56, and the fourth sacrificial layer 58 may include a semiconductor formed by a SEG method. For example, the first sacrificial layer 52, the second sacrificial layer 54, the third sacrificial layer 56, and the fourth sacrificial layer 58 may be a SiGe layer.

Growth rates and shapes of the vertical structures 60 may tend to depend on a configuration material of side walls of the trenches 25T. When the side walls of the trenches 25T are formed as layers having different configuration materials, the growth rates and shapes of the vertical structures 60 may be difficult to predict and may have different growth rates and shapes. The spacers 45 may serve to predict and equalize the growth rates and shapes of the vertical structures 60.

Figure 28:
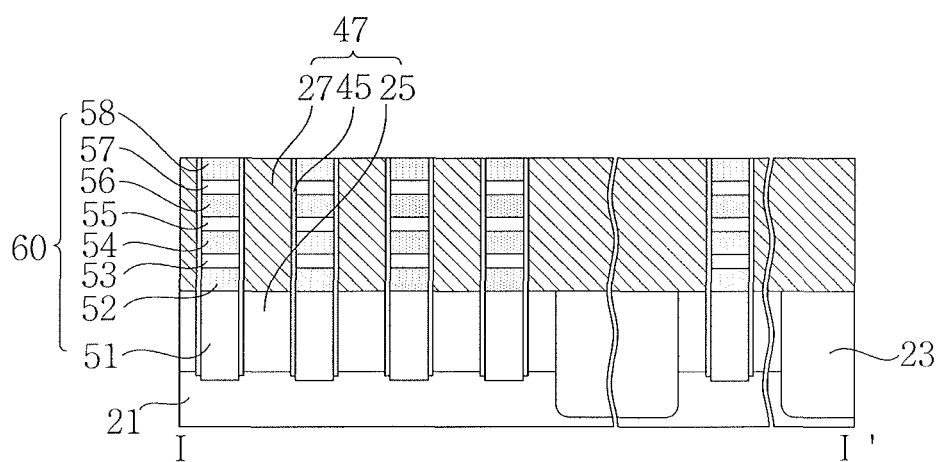

Referring to FIGS. 2 and 28, the lower preliminary electrode patterns 27 may be exposed by removing the capping layer 31. A chemical mechanical polishing (CMP) process, an etch-back process, or a combination thereof may be applied to the removal of the capping layer 31.

Figure 29:
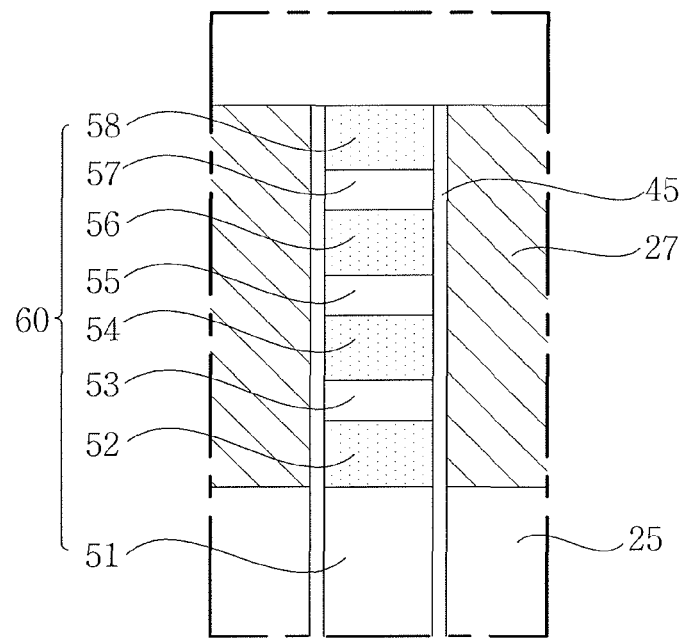
FIG. 29 illustrates a cross-sectional view of a portion of FIG. 28 in detail.

FIG. 29 is a cross-sectional view illustrating a portion of FIG. 28 in detail.

Referring to FIG. 29, side surfaces of the first semiconductor layer 51, the first sacrificial layer 52, the second semiconductor layer 53, the second sacrificial layer 54, the third semiconductor layer 55, the third sacrificial layer 56, the fourth semiconductor layer 57, and the fourth sacrificial layer 58 may be directly in contact with the spacers 45. The side surfaces of the first sacrificial layer 52, the second semiconductor layer 53, the second sacrificial layer 54, the third semiconductor layer 55, the third sacrificial layer 56, the fourth semiconductor layer 57, and the fourth sacrificial layer 58 may be vertically aligned on the side surfaces of the first semiconductor layer 51. The side surfaces of the first semiconductor layer 51, the first sacrificial layer 52, the second semiconductor layer 53, the second sacrificial layer 54, the third semiconductor layer 55, the third sacrificial layer 56, the fourth semiconductor layer 57, and the fourth sacrificial layer 58 may be substantially the same plane.

Figure 30:
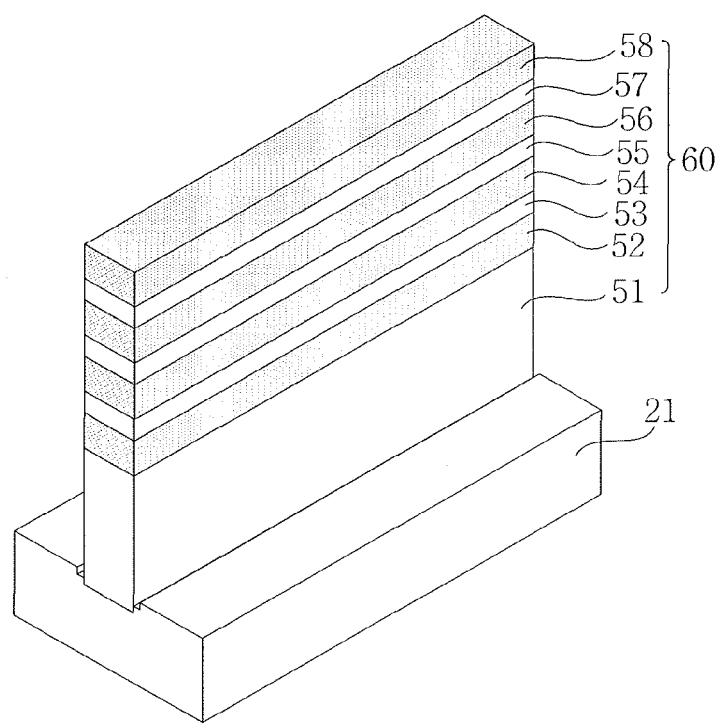
FIG. 30 illustrates a perspective view of a portion of FIG. 28.

FIG. 30 is a perspective view illustrating a portion of FIG. 28.

Referring to FIG. 30, the vertical structure 60 may be formed on the substrate 21. The first semiconductor layer 51, the first sacrificial layer 52, the second semiconductor layer 53, the second sacrificial layer 54, the third semiconductor layer 55, the third sacrificial layer 56, the fourth semiconductor layer 57, and the fourth sacrificial layer 58 may be sequentially stacked. The first sacrificial layer 52, the second semiconductor layer 53, the second sacrificial layer 54, the third semiconductor layer 55, the third sacrificial layer 56, the fourth semiconductor layer 57, and the fourth sacrificial layer 58 may be vertically aligned on the first semiconductor layer 51. The first semiconductor layer 51 may be interpreted as a fin active region. The second semiconductor layer 53, the third semiconductor layer 55, and the fourth semiconductor layer 57 may be interpreted as nano-sheets.

FIGS. 31 to 34 are cross-sectional views illustrating a portion of FIG. 28 in detail.

Figure 31:
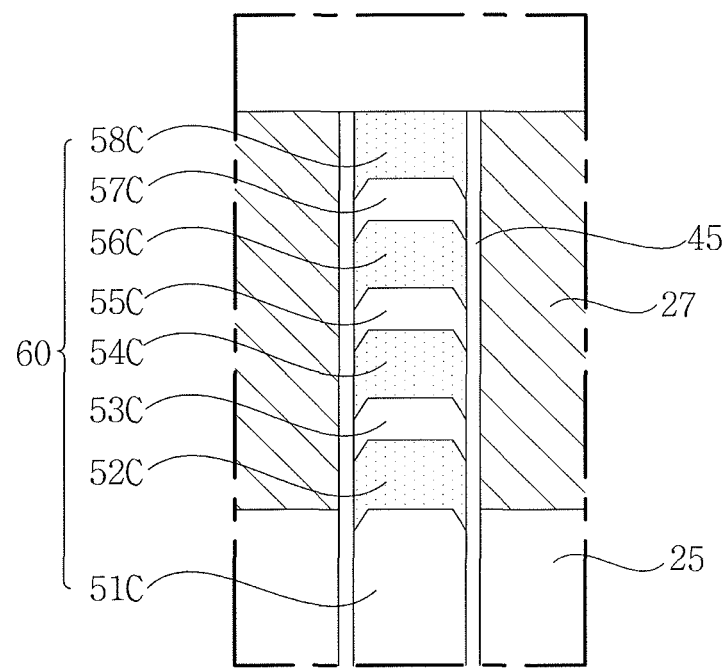
FIGS. 31 to 34 illustrate cross-sectional views of a portion of FIG. 28 in detail.

Referring to FIG. 31, a first sacrificial layer 52C, a second semiconductor layer 53C, a second sacrificial layer 54C, a third semiconductor layer 55C, a third sacrificial layer 56C, a fourth semiconductor layer 57C, and a fourth sacrificial layer 58C may be formed on a first semiconductor layer 51C. Edges of an upper surface of the first semiconductor layer 51C may be formed at a lower level than the center of the upper surface of the first semiconductor layer 51C. Edges of an upper surface of each of the first sacrificial layer 52C, the second semiconductor layer 53C, the second sacrificial layer 54C, the third semiconductor layer 55C, the third sacrificial layer 56C, and the fourth semiconductor layer 57C may be formed at a lower level than the center of the upper surface of each of the first sacrificial layer 52C, the second semiconductor layer 53C, the second sacrificial layer 54C, the third semiconductor layer 55C, the third sacrificial layer 56C, and the fourth semiconductor layer 57C. Edges of a lower surface of each of the first sacrificial layer 52C, the second semiconductor layer 53C, the second sacrificial layer 54C, the third semiconductor layer 55C, the third sacrificial layer 56C, and the fourth semiconductor layer 57C may be formed at a lower level than the center of the lower surface of each of the first sacrificial layer 52C, the second semiconductor layer 53C, the second sacrificial layer 54C, the third semiconductor layer 55C, the third sacrificial layer 56C, and the fourth semiconductor layer 57C. Edges of a lower surface of the fourth sacrificial layer 58C may be formed at a lower level than the center of the lower surface thereof.

Figure 32:
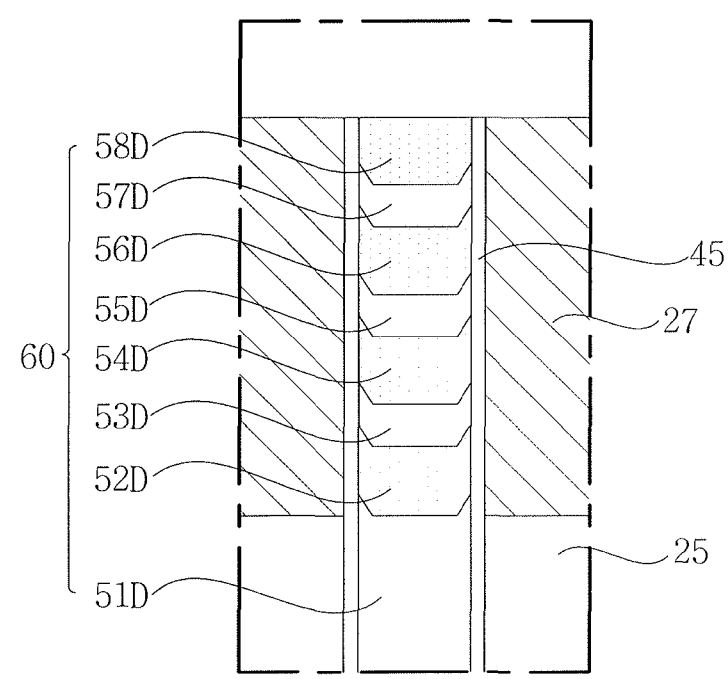

Referring to FIG. 32, a first sacrificial layer 52D, a second semiconductor layer 53D, a second sacrificial layer 54D, a third semiconductor layer 55D, a third sacrificial layer 56D, a fourth semiconductor layer 57D, and a fourth sacrificial layer 58D may be formed on a first semiconductor layer 51D. Edges of an upper surface of the first semiconductor layer 51D may be formed at a higher level than the center of the upper surface of the first semiconductor layer 51D. Edges of an upper surface of each of the first sacrificial layer 52D, the second semiconductor layer 53D, the second sacrificial layer 54D, the third semiconductor layer 55D, the third sacrificial layer 56D, and the fourth semiconductor layer 57D may be formed at a higher level than the center of the upper surface of each of the first sacrificial layer 52D, the second semiconductor layer 53D, the second sacrificial layer 54D, the third semiconductor layer 55D, the third sacrificial layer 56D, and the fourth semiconductor layer 57D. Edges of a lower surface of each of the first sacrificial layer 52D, the second semiconductor layer 53D, the second sacrificial layer 54D, the third semiconductor layer 55D, the third sacrificial layer 56D, and the fourth semiconductor layer 57D may be formed at a higher level than the center of the lower surface of each of the first sacrificial layer 52D, the second semiconductor layer 53D, the second sacrificial layer 54D, the third semiconductor layer 55D, the third sacrificial layer 56D, and the fourth semiconductor layer 57D. Edges of a lower surface of the fourth sacrificial layer 58D may be formed at a higher level than the center of the lower surface thereof.

Figure 33:
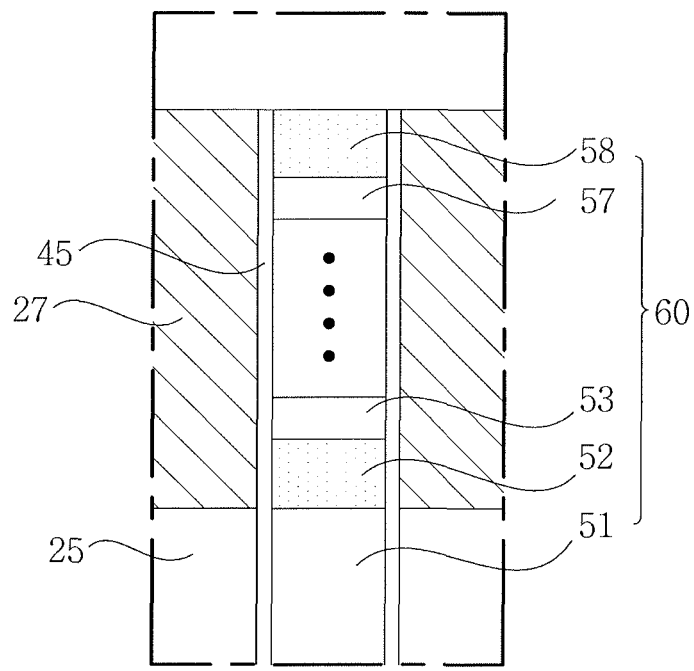

Referring to FIG. 33, a first sacrificial layer 52, a second semiconductor layer 53, a fourth semiconductor layer 57, and a fourth sacrificial layer 58 may be formed on a first semiconductor layer 51. A plurality of other sacrificial layers having a configuration similar to that of the first sacrificial layer 52 and a plurality of other semiconductor layers having a configuration similar to that of the second semiconductor layer 53 may be alternately and repeatedly formed between the second semiconductor layer 53 and the fourth semiconductor layer 57.

Figure 34:
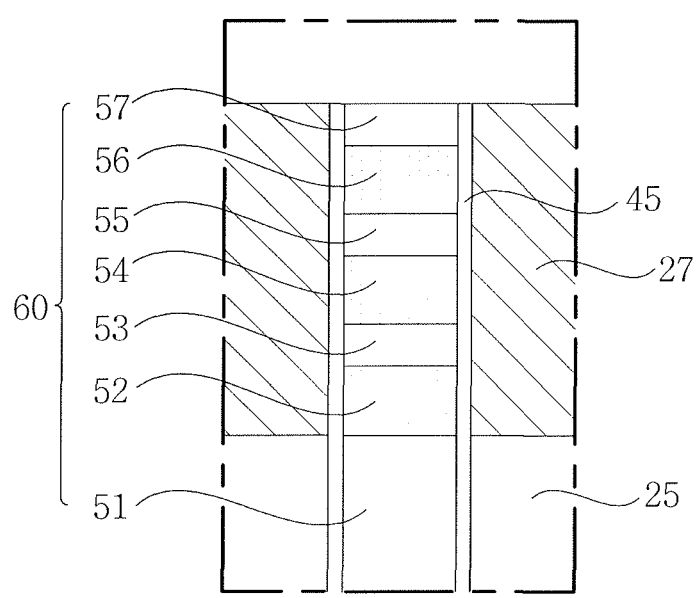

Referring to FIG. 34, the upper surfaces of the fourth semiconductor layer 57 and the lower preliminary electrode patterns 27 may be exposed on the same plane. The fourth sacrificial layer 58 may be removed. In an embodiment, the fourth sacrificial layer 58 may be omitted.

Figure 35:
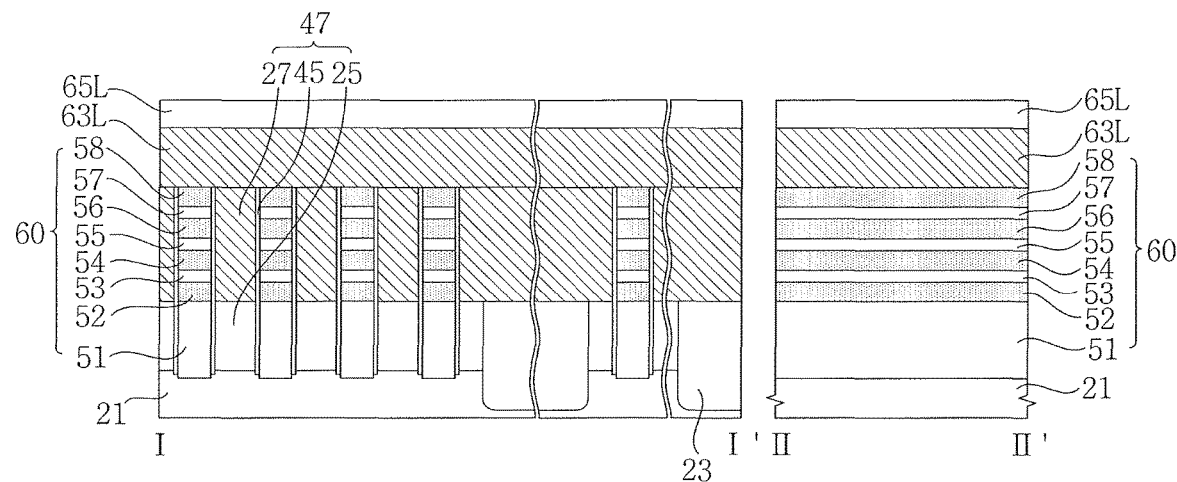

Referring to FIGS. 2 and 35, an upper preliminary electrode layer 63L and a gate capping layer 65L may be formed. The upper preliminary electrode layer 63L may cover the vertical structures 60, the lower preliminary electrode patterns 27, and the spacers 45. The upper preliminary electrode layer 63L may be directly in contact with the lower preliminary electrode patterns 27. The upper preliminary electrode layer 63L may include the same material as that of the lower preliminary electrode patterns 27. For example, the upper preliminary electrode layer 63L may include a polysilicon layer. The gate capping layer 65L may cover the upper preliminary electrode layer 63L. The gate capping layer 65L may include an insulating layer such as silicon oxide, silicon nitride, silicon oxynitride, or a combination thereof.

Figure 36:
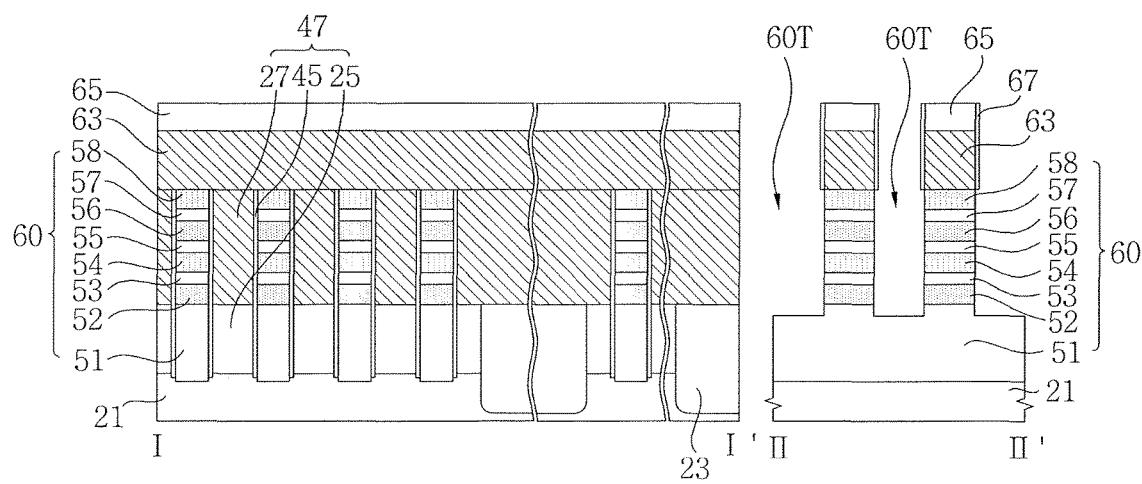

Referring to FIGS. 2 and 36, gate capping patterns 65 and upper preliminary electrodes 63 may be formed by patterning the gate capping layer 65L and the upper preliminary electrode layer 63L. While the upper preliminary electrode layer 63L is patterned, the lower preliminary electrode patterns 27 may be partially removed. The lower preliminary electrode patterns 27 may remain under the upper preliminary electrodes 63.

Gate spacers 67 which cover side surfaces of the gate capping patterns 65, the upper preliminary electrodes 63 and the lower preliminary electrode patterns 27 may be formed. A thin film forming process and an anisotropic etching process may be applied to the formation of the gate spacer 67. The gate spacer 67 may include an insulating layer such as silicon oxide, silicon nitride, silicon oxynitride, or a combination thereof. The gate spacer 67 may include a material having an etch selectivity with respect to the upper preliminary electrodes 63 and the lower preliminary electrode patterns 27.

Drain trenches 60T may be formed by partially removing the vertical structures 60 using the gate capping patterns 65 and the gate spacers 67 as etch masks. Bottoms of the drain trenches 60T may be formed at a lower level than an upper end of the first semiconductor layer 51. The side surfaces of the first semiconductor layer 51, the first sacrificial layer 52, the second semiconductor layer 53, the second sacrificial layer 54, the third semiconductor layer 55, the third sacrificial layer 56, the fourth semiconductor layer 57, and the fourth sacrificial layer 58 may be exposed in the drain trenches 60T.

Figure 37:
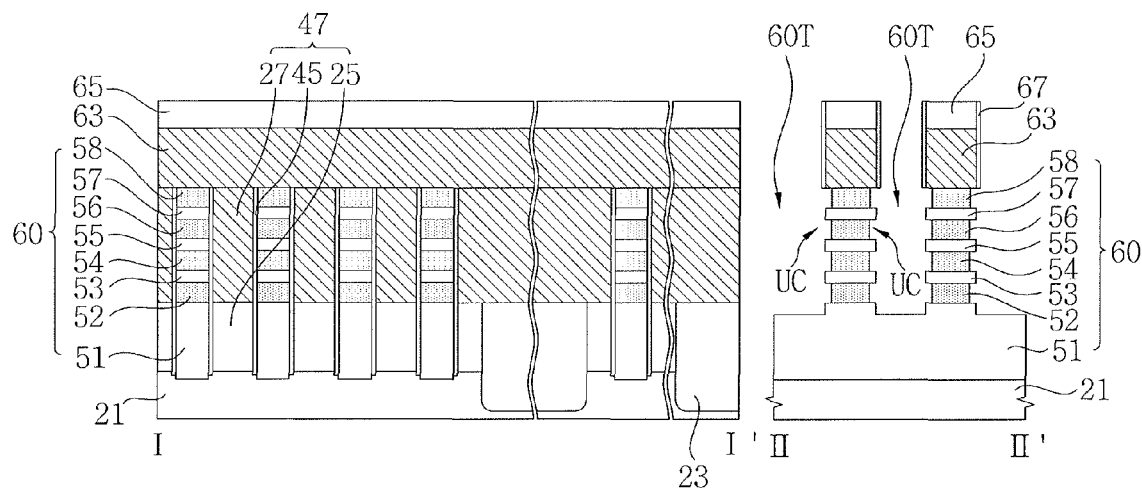

Referring to FIGS. 2 and 37, undercut (UC) regions may be formed by partially removing the first sacrificial layer 52, the second sacrificial layer 54, the third sacrificial layer 56, and the fourth sacrificial layer 58, which are exposed in the drain trenches 60T.

Figure 38:
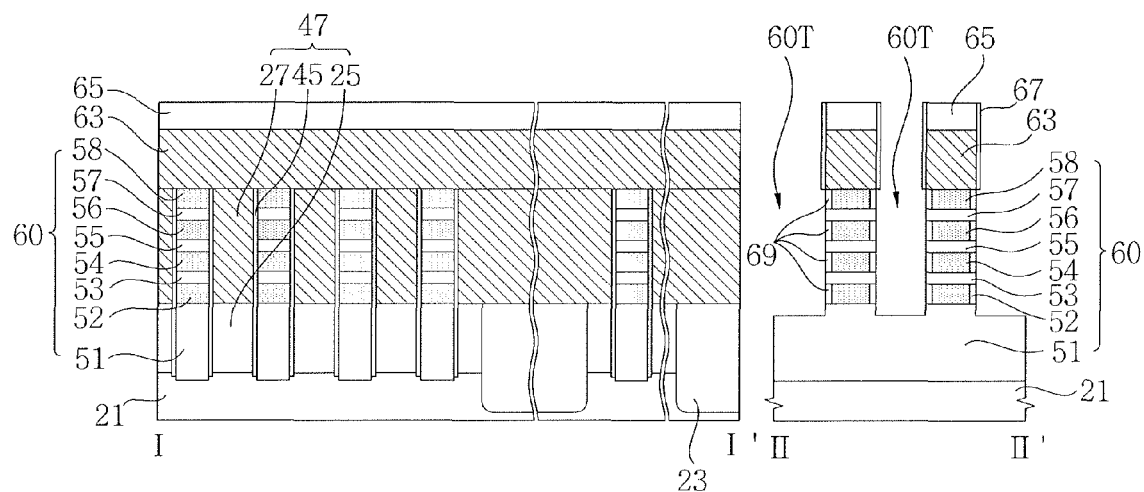

Referring to FIGS. 2 and 38, insulating plugs 69 which fill the UC regions may be formed. A thin film forming process and an etch-back process may be applied to the formation of the insulating plugs 69. The insulating plugs 69 may include a material having an etch selectivity with respect to the first sacrificial layer 52, the second sacrificial layer 54, the third sacrificial layer 56, and the fourth sacrificial layer 58. For example, the insulating plugs 69 may include SiOCN. The side surfaces of the first semiconductor layer 51, the second semiconductor layer 53, the third semiconductor layer 55, the fourth semiconductor layer 57, and the insulating plugs 69 may be exposed in the drain trenches 60T.

Figure 39:
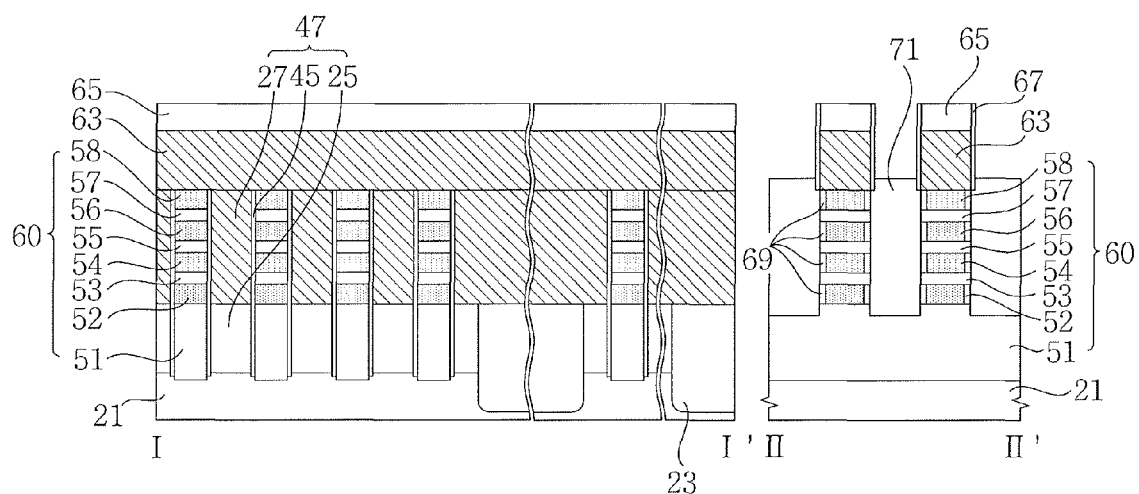

Referring to FIGS. 2 and 39, sources/drains 71 may be formed in the drain trenches 60T. The sources/drains 71 may be referred to as stressors, embedded stressors, or strain-inducing patterns. The sources/drains 71 may include Si, SiC, SiGe, or a combination thereof by an SEG method. The sources/drains 71 may include P-type impurities or N-type impurities. For example, when the sources/drains 71 have the P-type impurities, the sources/drains 71 may include an SiGe layer, an Si layer, or a combination thereof. When the sources/drains 71 have the N-type impurities, the sources/drains 71 may include an SiC layer, an Si layer, or a combination thereof.

Upper ends of the sources/drains 71 may be formed at a higher level than upper ends of the vertical structures 60. The sources/drains 71 may be directly in contact with the side surfaces of the first semiconductor layer 51, the second semiconductor layer 53, the third semiconductor layer 55, the fourth semiconductor layer 57, and the insulating plugs 69. The insulating plugs 69 may be interposed between the sources/drains 71 and the first sacrificial layer 52, between the sources/drains 71 and the second sacrificial layer 54, between the sources/drains 71 and the third sacrificial layer 56, and between the sources/drains 71 and the fourth sacrificial layer 58.

Figure 40:
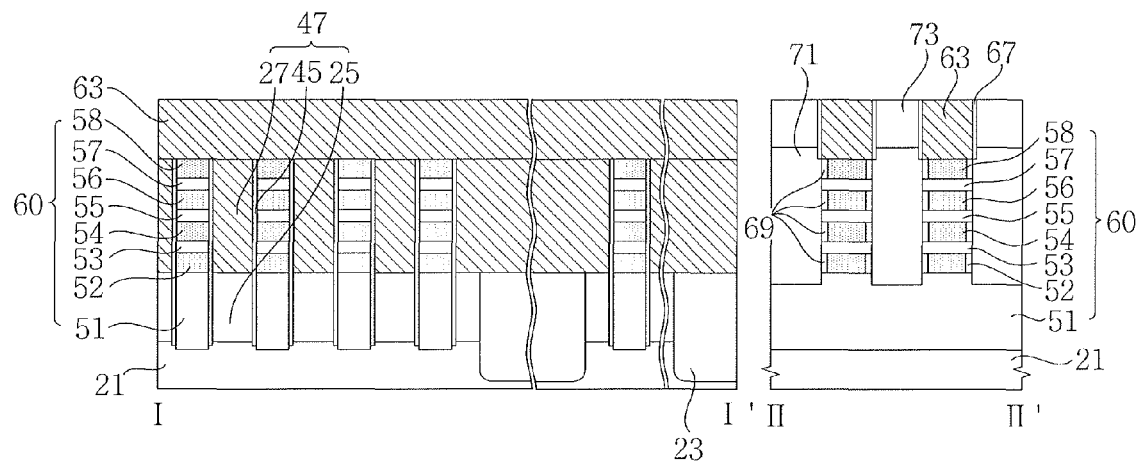

Referring to FIGS. 2 and 40, an upper insulating layer 73 which covers the sources/drains 71 may be formed. The upper insulating layer 73 may include an insulating layer such as silicon oxide, silicon nitride, silicon oxynitride, or a combination thereof. The upper preliminary electrodes 63 may be exposed by planarizing the upper insulating layer 73 and the gate capping patterns 65. The gate capping pattern 65 may be removed. Upper surfaces of the upper insulating layer 73, the gate spacer 67, and the upper preliminary electrodes 63 may be exposed on substantially the same plane.

Figure 41:
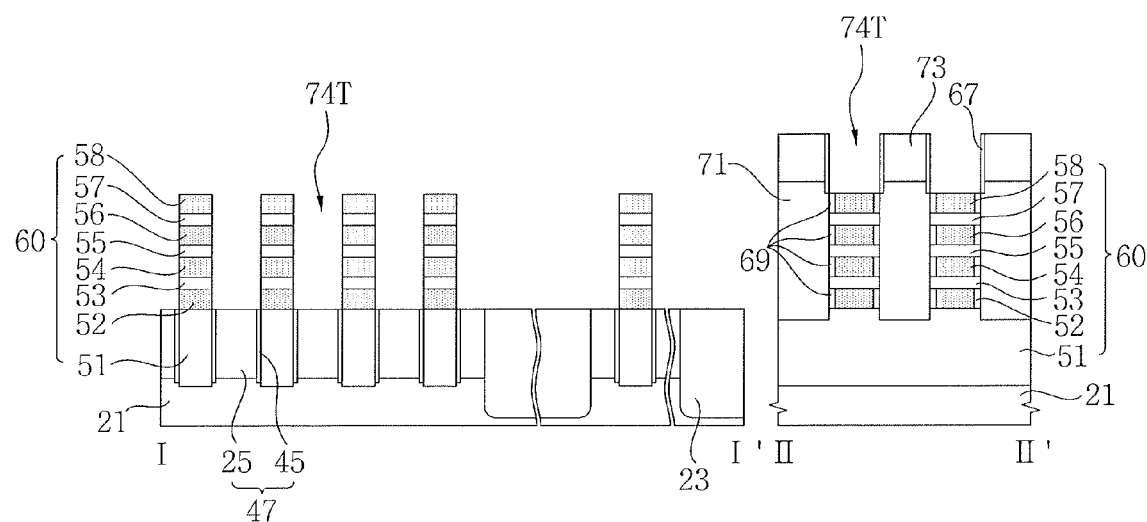

Referring to FIGS. 2 and 41, gate trenches 74T may be formed by removing the upper preliminary electrodes 63 and the lower preliminary electrode patterns 27. The lower insulating patterns 25 and the spacers 45 may be exposed on a bottom of the gate trench 74T. The first sacrificial layer 52, the second semiconductor layer 53, the second sacrificial layer 54, the third semiconductor layer 55, the third sacrificial layer 56, the fourth semiconductor layer 57, and the fourth sacrificial layer 58 may be exposed in the gate trenches 74T.

The lower preliminary electrode patterns 27 may include a material having an etch selectivity with respect to the lower insulating pattern 25. The bottoms of the gate trenches 74T may be formed over the entire surface of the substrate 21 to have a very uniform level.

Figure 42:
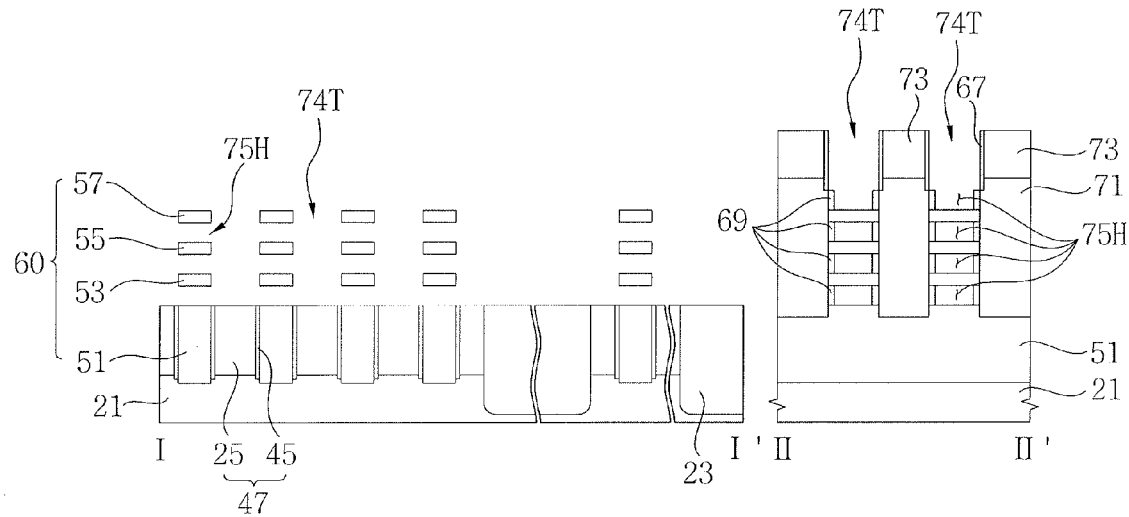

Referring to FIGS. 2 and 42, gate holes 75H may be formed by removing the first sacrificial layer 52, the second sacrificial layer 54, the third sacrificial layer 56, and the fourth sacrificial layer 58. The gate holes 75H may communicate with the gate trenches 74T. The insulating plugs 69 may serve to prevent the sources/drains 71 from being damaged due to the etching while the first sacrificial layer 52, the second sacrificial layer 54, the third sacrificial layer 56, and the fourth sacrificial layer 58 are removed.

Referring again to FIGS. 1 and 2, a gate dielectric layer 83 and gate electrodes 87 may be formed. The gate dielectric layer 83 may include a first gate dielectric layer 81 and a second gate dielectric layer 82. The gate electrode 87 may include a work function layer 85 and a low resistance layer 86. A thin film forming process and a planarization process may be applied to the formation of the gate dielectric layer 83 and the gate electrodes 87. The planarization process may include a CMP process, an etch-back process, or a combination thereof. The upper surfaces of the low resistance layer 86, the work function layer 85, the second gate dielectric layer 82, the gate spacer 67, and the upper insulating layer 73 may be exposed on substantially the same plane.

The first gate dielectric layer 81 may be referred to as an interfacial oxide layer. The first gate dielectric layer 81 may be formed using a cleaning process. The first gate dielectric layer 81 may include silicon oxide. The first gate dielectric layer 81 may be directly in contact with the first semiconductor layer 51, the second semiconductor layer 53, the third semiconductor layer 55, and the fourth semiconductor layer 57. The first gate dielectric layer 81 may surround the second semiconductor layer 53, the third semiconductor layer 55, and the fourth semiconductor layer 57.

The second gate dielectric layer 82 may include silicon oxide, silicon nitride, silicon oxynitride, a high-K dielectric layer, or a combination thereof. For example, the second gate dielectric layer 82 may include HfO or HfSiO. The second gate dielectric layer 82 may cover the first gate dielectric layer 81. The second gate dielectric layer 82 may surround the second semiconductor layer 53, the third semiconductor layer 55, and the fourth semiconductor layer 57. The first gate dielectric layer 81 may be interposed between the second gate dielectric layer 82 and the first semiconductor layer 51, between the second gate dielectric layer 82 and the second semiconductor layer 53, between the second gate dielectric layer 82 and the third semiconductor layer 55, and between the second gate dielectric layer 82 and the fourth semiconductor layer 57.

The low resistance layer 86 may be formed on the work function layer 85. The work function layer 85 may be interposed between the low resistance layer 86 and the second gate dielectric layer 82. The work function layer 85 may cover the vertical structures 60 and may be elongated in the gate holes 75H. The work function layer 85 may include an N-work function metal or a P-work function metal. For example, the N-work function metal may include TiC, TiAl, TaAl, HfAl, or a combination thereof, and the P-work function metal may include TiN. The low resistance layer 86 may include a conductive layer, e.g., W, WN, Ti, TiN, TIAl, TiAlC, Ta, TaN, Ni, Co, Mn, Al, Mo, Ru, Pt, Ag, Au, Cu, a conductive carbon, or a combination thereof.

According to embodiments, an isolation pattern and vertical structures which are in contact with a substrate by passing through the isolation pattern may be formed. Gate electrodes which cross the vertical structures may be formed. The isolation pattern may serve to prevent the vertical structures from collapsing. A lower end of the gate electrode may be formed over the entire surface of the substrate to have a very uniform level. A semiconductor device having an excellent electrical characteristic while vertical structures having a large aspect ratio are prevented from collapsing can be implemented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    an isolation pattern on a substrate, the isolation pattern including:
        a lower insulating pattern on the substrate, and
        a spacer to cover side surfaces of the lower insulating pattern;
    a vertical structure through the isolation pattern to contact the substrate, the vertical structure including:
        a first semiconductor layer on the substrate, a lower end of the first semiconductor layer being at a lower level than a lower surface of the isolation pattern,
        a second semiconductor layer on the first semiconductor layer, and
        a third semiconductor layer on the second semiconductor layer; and
    a gate electrode crossing the vertical structure and extending over the isolation pattern.

2. The device as claimed in claim 1, wherein the lower insulating pattern is directly in contact with the substrate, and the lower end of the first semiconductor layer is at a lower level than a lower end of the spacer.

3. The device as claimed in claim 1, wherein the spacer is between the first semiconductor layer and the lower insulating pattern, and the first semiconductor layer is directly in contact with the spacer.

4. The device as claimed in claim 1, wherein a vertical height of the first semiconductor layer is at least twice a horizontal width thereof.

5. The device as claimed in claim 1, wherein an upper end of the first semiconductor layer is at a higher level than an upper end of the lower insulating pattern, and a lower end of the gate electrode is at a lower level than the upper end of the first semiconductor layer.

6. The device as claimed in claim 1, wherein an upper end of the first semiconductor layer is at a lower level than an upper end of the lower insulating pattern, and a lower end of the gate electrode is at a lower level than the upper end of the lower insulating pattern.

7. The device as claimed in claim 1, wherein the second semiconductor layer and the third semiconductor layer are vertically aligned on the first semiconductor layer, and the second semiconductor layer and the third semiconductor layer are at a higher level than an upper end of the isolation pattern.

8. The device as claimed in claim 1, wherein edges of an upper surface of the first semiconductor layer are at a lower level than a center of the upper surface of the first semiconductor layer, edges of a lower surface of the second semiconductor layer are at a lower level than a center of the lower surface of the second semiconductor layer, and edges of a lower surface of the third semiconductor layer are at a lower level than a center of the lower surface of the third semiconductor layer.

9. The device as claimed in claim 1, wherein edges of an upper surface of the first semiconductor layer are at a higher level than a center of the upper surface of the first semiconductor layer, edges of an upper surface of the second semiconductor layer are formed at a higher level than a center of the upper surface of the second semiconductor layer, and edges of an upper surface of the third semiconductor layer are formed at a higher level than a center of the upper surface of the third semiconductor layer.

10. The device as claimed in claim 1, wherein the gate electrode includes:
    a work function layer; and
    a low resistance layer on the work function layer,
        wherein the work function layer is elongated between the first semiconductor layer and the second semiconductor layer, surrounds an upper surface, a lower surface, and side surfaces of the second semiconductor layer, and surrounds an upper surface, a lower surface, and side surfaces of the third semiconductor layer.

11. The device as claimed in claim 10, further comprising a gate dielectric layer between the work function layer and the first semiconductor layer, between the work function layer and the second semiconductor layer, and between the work function layer and the third semiconductor layer.

12. The device as claimed in claim 11, wherein upper ends of the gate dielectric layer, the work function layer, and the low resistance layer are substantially the same plane.

13. The device as claimed in claim 10, further comprising a source/drain adjacent to side surfaces of the gate electrode and in contact with the side surfaces of the first semiconductor layer, the second semiconductor layer, and the third semiconductor layer.

14. The device as claimed in claim 13, further comprising an insulating plug on side surfaces of the source/drain,
   wherein the insulating plug is between the first semiconductor layer and the second semiconductor layer and between the second semiconductor layer and the third semiconductor layer, and the insulating plug is between the source/drain and the work function layer.

15. A semiconductor device, comprising:
   an isolation pattern on a substrate, the isolation pattern including:
      a lower insulating pattern on the substrate, and
      a spacer to cover side surfaces of the lower insulating pattern;
   a vertical structure through the isolation pattern to be in contact with the substrate and with the spacer, the vertical structure protruding above the isolation pattern and including at least three semiconductor layers; and
   a gate electrode crossing the vertical structure and extending over the isolation pattern.

16. A semiconductor device, comprising:
   an isolation pattern on a substrate, the isolation pattern including:
      a lower insulating pattern on the substrate, and
      a spacer on side surfaces of the lower insulating pattern;
   a vertical structure extending through an entire thickness of the isolation pattern and contacting the substrate, the vertical structure including:
      a first semiconductor layer through the isolation pattern, the first semiconductor layer extending beyond the isolation pattern into the substrate, and
      a second semiconductor layer on the first semiconductor layer, the second semiconductor layer being above the isolation pattern, and
      a third semiconductor layer on the second semiconductor layer; and
   a gate electrode crossing the vertical structure and extending over the isolation pattern.

17. The device as claimed in claim 16, wherein a distance between a lower surface of the first semiconductor layer and a bottom of the substrate is smaller than a distance between a lower surface of the isolation pattern and the bottom of the substrate.

18. The device as claimed in claim 17, wherein the isolation pattern overlaps a majority of a vertical height of the first semiconductor layer.

19. The device as claimed in claim 17, wherein a vertical height of the first semiconductor layer is at least twice longer than a horizontal width of the first semiconductor.

20. The device as claimed in claim 17, wherein the first semiconductor layer is in direct contact with the spacer and substrate.

* * * * *